(12) United States Patent
Murata et al.

(10) Patent No.: US 7,859,586 B2
(45) Date of Patent: Dec. 28, 2010

(54) SOLID-STATE IMAGING DEVICE, ITS PRODUCTION METHOD, CAMERA WITH THE SOLID-STATE IMAGING DEVICE, AND LIGHT RECEIVING CHIP

(75) Inventors: Takahiko Murata, Osaka (JP); Shigetaka Kasuga, Osaka (JP); Takumi Yamaguti, Kyoto (JP)

(73) Assignee: Panasonic Corporation, Osaka (JP)

( * ) Notice: Subject to any disclaimer, the term of this patent is extended or adjusted under 35 U.S.C. 154(b) by 662 days.

(21) Appl. No.: 10/583,095

(22) Filed: Jun. 16, 2007

(65) Prior Publication Data

US 2007/0247534 A1    Oct. 25, 2007

(30) Foreign Application Priority Data

Dec. 18, 2003  (JP)  ............... 2003-421117
Dec. 18, 2003  (JP)  ............... 2003-421118
Dec. 18, 2003  (JP)  ............... 2003-421119

(51) Int. Cl.
*H04N 5/225* (2006.01)
*G02B 13/16* (2006.01)

(52) U.S. Cl. .................. 348/335; 348/340; 348/345; 348/348

(58) Field of Classification Search ............... 348/335, 348/340, 345, 348
See application file for complete search history.

(56) References Cited

U.S. PATENT DOCUMENTS 6,266,197 B1 *  7/2001  Glenn et al. ............. 359/819
6,342,406 B1    1/2002  Glenn et al.

6,534,340 B1    3/2003  Karpman et al.

(Continued)

FOREIGN PATENT DOCUMENTS

EP      1 041 628       10/2000

(Continued)

OTHER PUBLICATIONS

Partial Supplementary European Search Report issued in European Patent Application No. EP 08011555.3 dated Jan. 20, 2009.

(Continued)

*Primary Examiner*—Yogesh K Aggarwal
(74) *Attorney, Agent, or Firm*—McDermott Will & Emery LLP

(57) ABSTRACT

Provided is a light-receiving chip whose transparent protection plate has an area equal to or smaller than an area of the light-receiving chip, and which does not require a base portion for mounting. Provision of the light-receiving chip contributes to reduction in size and weight of cameras. In addition, provision of a solid-state imaging apparatus having excellent productivity contributes to reduction in price of cameras. A solid-state imaging apparatus (10) having: a solid-state imaging device (11) (a light-receiving chip) provided with a plurality of light-receiving cells arranged either one dimensionally or two dimensionally on one main surface of a base substrate; and a transparent protection plate (12) provided to cover a light-receiving area (18) (the plurality of light-receiving cells), where an area of the transparent protection plate is equal to or smaller than an area of the light-receiving chip, and a space (20) is formed between the light-receiving cells and the transparent protection plate.

14 Claims, 32 Drawing Sheets

U.S. PATENT DOCUMENTS

| | | |
|---|---|---|
| 2002/0105591 A1 | 8/2002 | Nakamura et al. |
| 2003/0080434 A1 | 5/2003 | Wataya |
| 2004/0077121 A1 | 4/2004 | Maeda et al. |

FOREIGN PATENT DOCUMENTS

| | | |
|---|---|---|
| EP | 1 376 705 | 1/2004 |
| EP | 1 503 420 A | 2/2005 |
| JP | 5-326904 A | 12/1993 |
| JP | 7-86544 A | 3/1995 |
| JP | 9-69618 A | 3/1997 |
| JP | 10-313070 A | 11/1998 |
| JP | 11-74496 A | 3/1999 |
| JP | 2000-286401 A | 10/2000 |
| JP | 2001-036099 A | 2/2001 |
| JP | 2002-231921 | 8/2002 |
| JP | 2002-329850 A | 11/2002 |
| JP | 2003-116066 A | 4/2003 |
| JP | 2003-303947 A | 10/2003 |
| JP | 2003-347529 A | 12/2003 |

OTHER PUBLICATIONS

Supplementary Partial European Search Report issued in European Patent Application No. EP 04 80 7285, dated Mar. 28, 2007.

* cited by examiner

FIG.11
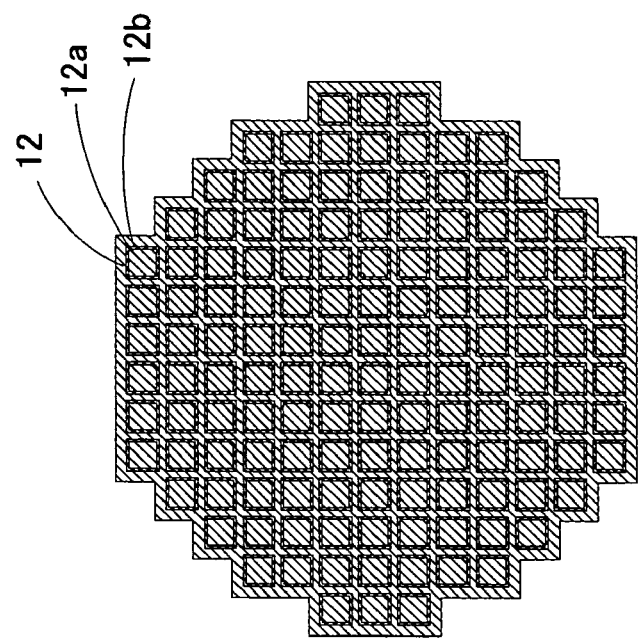
(b)
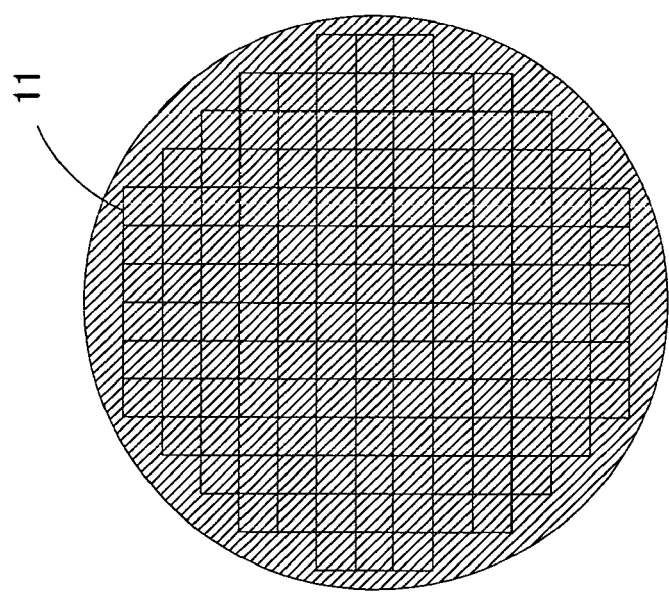
(a)

FIG.13
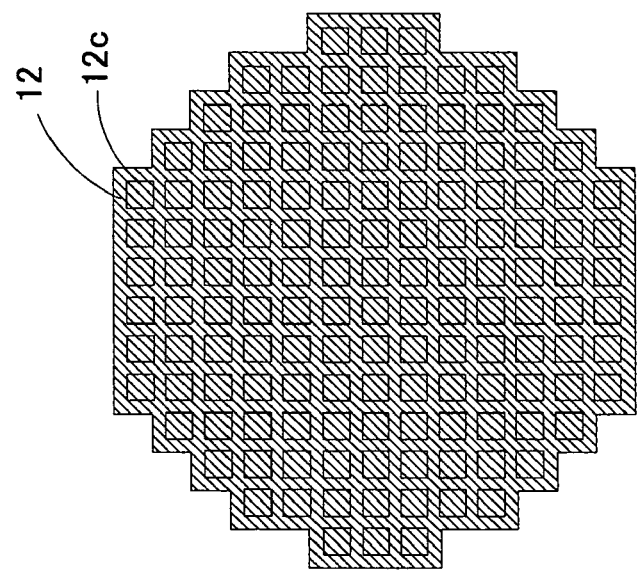
(b)
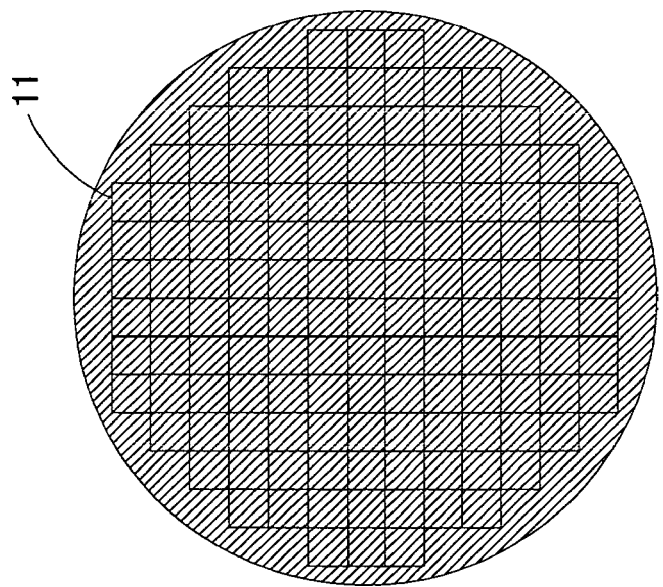
(a)

FIG.15
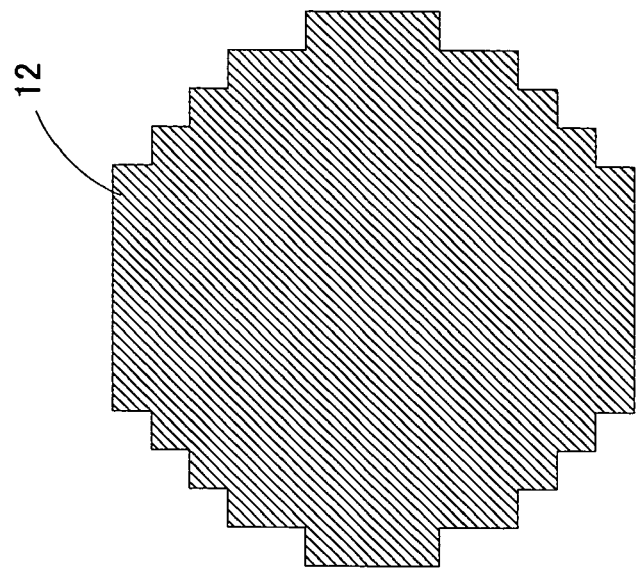
(b)
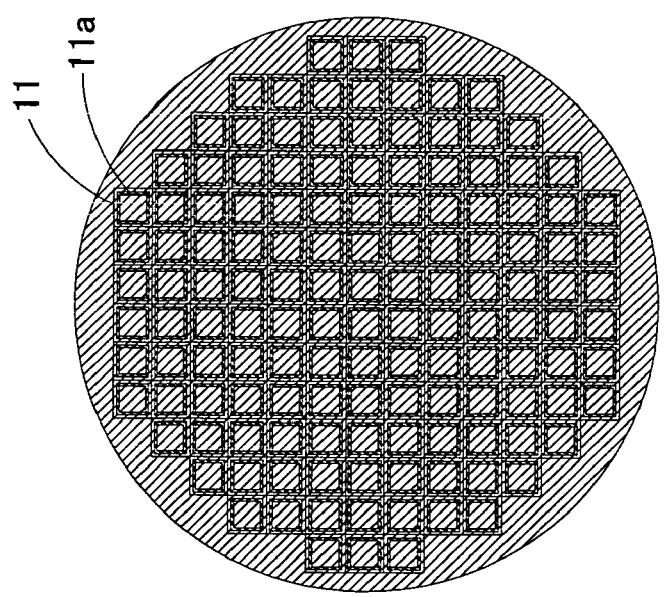
(a)

SOLID-STATE IMAGING DEVICE, ITS PRODUCTION METHOD, CAMERA WITH THE SOLID-STATE IMAGING DEVICE, AND LIGHT RECEIVING CHIP

RELATED APPLICATIONS

This application is the U.S. National Phase under 35 U.S.C. §371 of International Application No. PCT/JP2004/018927, filed on Dec. 17, 2004, which in turn claims the benefit of Japanese Application No. 2003-421117 filed on Dec. 18, 2003, and Japanese Application No. 2003-421118 filed on Dec. 18, 2003, and Japanese Application No. 2003-421119 filed on Dec. 18, 2003, the disclosures of which Applications are incorporated by reference herein.

TECHNICAL FIELD

The present invention relates to a solid-state imaging apparatus, and particularly relates to a technology of reducing the size of an imaging apparatus and of improving productivity of such imaging apparatuses.

BACKGROUND ART

Recently, various imaging apparatuses such as a home video camera and a digital still camera have been commercially available.

Some types of such imaging apparatuses are equipped with a solid-state imaging apparatus.

Japanese Laid-open patent application No. H7-086544 (hereinafter, Patent Reference 1) and Japanese Laid-open Patent Application No. H10-313070 (hereinafter, Patent Reference 2) disclose such conventional solid-state imaging apparatuses.

FIG. 1A is a plan view showing an overview of a conventional solid-state imaging apparatus 100 disclosed in the Patent Reference 1.

FIG. 1B is a diagram showing a cross sectional view of the solid-state imaging apparatus 100 of FIG. 1A, which is cut at the line of A-A'.

As FIG. 1A and FIG. 1B show, the conventional solid-state imaging apparatus 100 has a structure in which a CCD chip 110 is mounted to a glass substrate 120 via an anisotropic conductive adhesive 130.

The CCD chip 110 is shaped as a square. Eight input/output terminal pads 111 are provided along each of the right hand side and the left hand side of the square of the CCD chip 110. Underneath each of the input/output terminal pads 111, a bump 112 having a height of about 10 µm is provided.

The glass substrate 120 is in a rectangular shape which is larger than the CCD chip 110. Sixteen electrode pads 121 (8 on the right hand side and 8 on the left hand side) are provided on the glass substrate 120, in position corresponding to the bumps 112 of the CCD chip 110. Sixteen wirings 122 are formed on the upper surface of the glass substrate 120.

One end of each of the wirings is collected to the right hand side of the glass substrate 120, and the other end the wiring is connected to a corresponding electrode pad 121.

For the purpose of moisture resistance and the like, a sealing material 140 made of resin is formed on the glass substrate 120 in position corresponding to the contour of the CCD chip 110.

FIG. 2A is a plan view showing an overview of a conventional solid-state imaging apparatus 200 disclosed in the Patent Reference 2.

FIG. 2B is a diagram showing a cross sectional view of the solid-state imaging apparatus 200 of FIG. 2A, which is cut at the line of A-A'.

As FIG. 2A and FIG. 2B show, the conventional solid-state imaging apparatus 200 has the following structure. A chip bonding portion 211 is created as a concave groove, at the center of a base portion 210 (made of molded resin) of the solid-state imaging apparatus 200. To the chip bonding portion 211, a CCD chip 230 is attached via a silver paste 220. A bonding pad on the CCD chip 230 is connected to lead frames 240 via bonding wires 250. Furthermore, a sealing glass 270 is attached to the base portion 210 via a potting resin layer 260, so as to seal the CCD chip 230 together with the bonding wires 250 airtight.

Patent Reference 1: Japanese Laid-open Patent application No. H7-086544

Patent Reference 2: Japanese Laid-open Patent Application No. H10-313070

DISCLOSURE OF THE INVENTION

Problems the Invention is Going to Solve

In the conventional solid-state imaging apparatus 100 disclosed in the Patent Reference 1, the glass substrate 120 is substantially larger, in area, than the CCD chip 110.

This is because the glass substrate 120 has to have a part thereof to connect to an external device, at the surface thereof that faces towards the CCD chip 110 but does not overlap with the CCD chip 110 in position.

As a result, in the Patent Reference 1, the area of the glass substrate 120 is the major factor defining the area of the entire solid-state imaging apparatus 100, and so the area of the solid-state imaging apparatus is inherently larger than the area of the CCD chip 110.

In addition, in the solid-state imaging apparatus 200 of the Patent Reference 2, the base portion 210 and the sealing glass 270 are respectively larger, in area, than the CCD chip 230.

Therefore, the exterior size of the base portion 210 or the sealing glass 270 is the major factor defining the exterior size of the entire solid-state imaging apparatus 200, and so the exterior size of the solid-state imaging apparatus 200 will be substantially larger than the exterior size of the CCD chip 230.

Meanwhile, it is strongly demanded to reduce the size and the weight of imaging apparatuses. Particularly for a camera-included portable telephone, reduction in size and weight of imaging apparatuses is a compelling problem. Even a small difference in size and weight of an imaging apparatus would largely affect the sales of the camera-included portable telephone. So as to minimize the difference in size and weight with portable cameras that do not include a camera, it is strongly desired to reduce the size and the weight of solid-state imaging apparatuses in the field of camera-included portable telephone.

In view of the described problems, the first object of the present invention is to reduce the size and the weight of the whole of a solid-state imaging apparatus, and further to contribute to reduction of size and weight of a camera to which the solid-state imaging apparatus is mounted, by reducing the area of a transparent protection plate such as a glass substrate, down to the area of a light-receiving chip or smaller, and by realizing a light-receiving chip that does not require a base portion through which mounting to an external device is performed.

Here, in the solid-state imaging apparatus 100 of the Patent Reference 1, the area of the glass substrate 120 is clearly larger than the area of the CCD chip 110, and so attaching of the CCD chip 110 to the glass substrate 120 is performed after cutting a wafer into chips.

In the solid-state imaging apparatus 200 of the Patent Reference 2, it is required to perform, after production of a wafer and cutting the wafer into chips, many steps to each chip such as a die bonding step, a wire bonding step, a potting resin layer application step, a seal glass attaching step, a potting resin layer hardening step, and a lead frame forming step, which degrades productivity.

In addition, in the solid-state imaging apparatus 200 of the Patent Reference 2, the distance between the sealing glass 270 and the CCD chip 230 is defined by the thickness of the potting resin layer 260, and so tends to have variations, which makes production difficult.

In view of this, the second object of the present invention is to provide a solid-state imaging apparatus having excellent productivity, and a manufacturing method of such a solid-state imaging apparatus having excellent productivity, so as to realize cost reduction of a solid-state imaging apparatus, and further to realize cost reduction of a camera to which the solid-state imaging apparatus is mounted.

MEANS TO SOLVE THE PROBLEMS

So as to achieve the above-stated objects, a solid-state imaging apparatus according to the present invention is a solid-state imaging apparatus having: a light-receiving chip having a plurality of light-receiving cells arranged either one dimensionally or two dimensionally on one main surface of a base substrate; and a transparent protection plate attached to the main surface of the base substrate to cover the light-receiving cells, a space being formed between the light-receiving cells and the transparent protection plate, where an area of the transparent protection plate is equal to or smaller than an area of the light-receiving chip.

So as to achieve the above-stated objects, a camera of the present invention has a solid-state imaging apparatus according to the present invention.

So as to achieve the above-stated objects, a light-receiving chip according to the present invention is a light-receiving chip having: a plurality of light-receiving cells arranged either one dimensionally or two dimensionally on a first main surface of a base substrate; a plurality of input/output lines provided on the first main surface of the base substrate; a plurality of electrodes for connecting to outside devices, the electrodes being formed on a second main surface of the base substrate that is opposite to the first main surface; and a plurality of conductive units insulated from each other, each conductive unit electrically connecting one of the input/output lines with a corresponding one of the electrodes.

So as to achieve the above-stated objects, a manufacturing method of solid-state imaging apparatus according to the present invention is a manufacturing method of solid-state imaging apparatuses each having: a light-receiving chip provided with a set of light-receiving cells arranged either one dimensionally or two dimensionally on one main surface of a base substrate; and a transparent protection plate, the manufacturing method including: a protection-plate preparing step of preparing a plurality of transparent protection plates each having an area that is equal to or smaller than an area of the light-receiving chip; an attaching step of attaching the prepared transparent protection plates onto a semiconductor wafer of light-receiving chips so that each set of light-receiving cells is covered by a corresponding one of the transparent protection plates, thereby generating an attached member in which the transparent protection plates are attached to the light-receiving chips; and a cutting step of cutting the attached member generated in the attaching step into respective solid-state imaging apparatuses.

EFFECTS OF THE INVENTION

In the above-stated solid-state imaging apparatus and the above-stated camera, the area of a solid-state imaging apparatus is not larger than the area of a light-receiving chip. According to this characteristic, in a manufacturing process, it becomes possible to attach transparent protection plates to a wafer, and to thereafter cut them together into respective chips. The productivity of such a manufacturing process is much better than that of the conventional processes.

In addition, the index of refraction in a space formed between a light-receiving cell and a corresponding transparent protection plate is smaller than the index of refraction of a collective lens normally provided on the light-receiving cell. Therefore, formation of the space enables favorable light-collective characteristics.

Accordingly, it becomes possible to reduce the price of a solid-state imaging apparatus, which further contributes to price reduction of a camera.

In addition, in the solid-state imaging apparatus and the camera, the light-receiving chip further has: a plurality of input/output lines provided on the main surface of the base substrate on which the light-receiving cells are arranged, the main surface being a first main surface; a plurality of electrodes for connecting to outside devices, the electrodes being provided on a second main surface of the base substrate that is opposite to the first main surface; and a plurality of conductive units insulated from each other, each conductive unit electrically connecting one of the input/output lines with a corresponding one of the electrodes.

According to the solid-state imaging apparatus, the camera, and the light-receiving chip, the electrodes for outside connection are provided on the second main surface that is different from the first main surface. Accordingly, it becomes possible to reduce the area of a transparent protection plate to be equal to or smaller than the area of a light-receiving chip.

This further leads to reduction of size and weight of an entire solid-state imaging apparatus, which contributes to reduction of size and weight of a camera.

In addition, for example, for a conventional type that seals a bonding wire airtight, the distance between a surface of a light-receiving chip and a transparent protection plate should be at least about the height of the bonding wire, so as to prevent the bonding wire from interfering with the light-receiving chip or with the transparent protection plate. However, the stated structure does not require a bonding wire, and that the distance may be equal to or smaller than the height of a bonding wire, which enables the thickness of a solid-state imaging apparatus to be thinner than conventionally. This creates a multiplier effect with the area reduction effect stated above, in reducing the size of a camera.

In addition, in the solid-state imaging apparatus, the camera, and the light-receiving chip, each of the conductive units is a through hole provided through the base substrate.

According to the stated structures, a through hole is generated instead of a conventional bonding pad. Therefore, the designing is performed without any regard to the conventional designing rule that depends on the accuracy of a wire bonding apparatus, and the like.

As a result, it becomes possible to have expectations that the area of the light-receiving chip be reduced because the structures allow greater layout flexibility, which contributes to reduction in size and weight of a camera.

Moreover, provision of a plurality of through holes is performed onto a wafer, which is a manufacturing advantage.

In addition, in the solid-state imaging apparatus, the camera, and the light-receiving chip, each of the electrodes is provided on an opening of a corresponding through hole on the second main surface.

According to the stated structures, no wiring pattern is required on the second main surface. Therefore the manufacturing process becomes simpler and the effect of reducing the manufacturing cost can be expected.

In addition, in the solid-state imaging apparatus, the camera, and the light-receiving chip, each of the conductive units is a wiring formed on a side surface of the base substrate.

According to the stated structure, a wiring pattern is provided for a side surface, instead of provision of a conventional bonding pad. Therefore the entire area of a bonding pad becomes unnecessary. Therefore, the designing is performed without any regard to the conventional designing rule that depends on the accuracy of a wire bonding apparatus, and the like.

Accordingly, it is possible to have expectations that the area of the light-receiving chip be reduced because the structures allow greater layout flexibility, which contributes to reduction in size and weight of a camera.

In addition, in the solid-state imaging apparatus and the camera, the light-receiving chip further has: a plurality of input/output lines provided on the main surface of the base substrate on which the light-receiving cells are arranged, the main surface being a first main surface; a plurality of electrodes for connecting to outside devices, the electrodes being formed on a second main surface of the base substrate that is opposite to the first main surface; and a plurality of conductive units insulated from each other, each conductive unit electrically connecting one of the input/output lines with a corresponding one of the electrodes; and a plurality of collective lenses provided on a light-receiving of the one main surface of the base substrate, where the space is formed between the collective lenses and the transparent protection plate, and an index of refraction of the space is smaller than an index of refraction of the collective lenses.

According to the stated structures, the electrodes for outside connection are provided on the second main surface that is different from the first main surface (the first main surface being the light-receiving surface for the light-receiving chip). Therefore, the area of a transparent protection plate is able to be reduced to equal to or smaller than the area of a light-receiving chip.

Therefore, the entire solid-state imaging apparatus is able to be reduced in size and weight, which contributes to reduction in size and weight of a camera.

In addition, on the side of the light-receiving surface, there is no conjunction part such as a bump, and no protrusion such as a wire bonding. Therefore, it becomes possible to reduce the space formed between a collective lens and a transparent protection plate.

In addition, in the solid-state imaging apparatus and the camera, the solid-state imaging apparatus further has: a sealing material operable to fix the base substrate and the transparent protection plate, where the first main surface is made up of the light-receiving area on which the light-receiving cells are arranged and a periphery area surrounding the light-receiving area, the sealing material being provided on the periphery area, and the space is sealed airtight by means of the base substrate, the transparent protection plate, and the sealing material.

According to the stated structures, the light-receiving area is sealed airtight, and so is prevented from dust or from corrosion.

In addition, in the solid-state imaging apparatus and the camera, the main surface is made up of a light-receiving area on which the light-receiving cells are arranged and a periphery area surrounding the light-receiving area, the transparent protection plate has a skirt portion at a periphery thereof, and the skirt portion is attached onto the periphery area of the main surface, thereby sealing the light-receiving cells airtight and forming the space between the light-receiving cells and the transparent protection plate.

According to the stated structures, the distance between the light-receiving area and the transparent protection plate depends on the accuracy of the form of the transparent protection plate. Therefore, the distance hardly varies, which contributes to productivity improvement.

In addition, in the solid-state imaging apparatus and the camera, the skirt portion is formed by plating metal on the periphery of the transparent protection plate that is a flat plate made of glass or resin.

In addition, in the solid-state imaging apparatus and the camera, the transparent protection plate is a flat plate made of resin, and the skirt portion is formed by pressing the flat resin plate.

According to the stated structures, manufacturing enables the distance between the light-receiving area and the transparent protection plate to be in the accuracy of about several µm.

In addition, in the solid-state imaging apparatus and the camera, the main surface is made up of a light-receiving area on which the light-receiving cells are arranged and a periphery area surrounding the light-receiving area, the light-receiving chip has, on the periphery area of the main surface, a rib portion having a loop shape, the rib portion is attached onto a periphery of the transparent protection plate, thereby sealing the light-receiving cells airtight and forming the space between the light-receiving cells and the transparent protection plate.

According to the stated structures, the distance between the light-receiving area and the transparent protection plate depends on the accuracy of the form of the light-receiving chip. Therefore, the distance hardly varies, which contributes to productivity improvement.

In addition, in the solid-state imaging apparatus and the camera, the rib portion is an insulator made of a material for protective foil.

According to the stated structures, manufacturing enables the distance between the light-receiving area and the transparent protection plate to be in the accuracy of about several µm.

Furthermore, rib-portion forming is performed in the diffusion process that is prior to the chip-cutting process, and so no extra process is required for the rib-portion forming, which contributes to productivity improvement.

In addition, in the solid-state imaging apparatus and the camera, being manufactured by attaching transparent protection plates onto a semiconductor wafer of light-receiving chips to generate an attached member in which the transparent protection plates are attached to the light-receiving chips respectively, and cutting the attached member into respective solid-state imaging apparatuses.

According to the stated structures, the transparent protection plates are attached to the wafer, and then the resulting attached member is cut into respective chips, which contributes to great productivity improvement compared to conventional cases.

Accordingly, it becomes possible to reduce the price of a solid-state imaging apparatus, which further contributes to price reduction of a camera.

In addition, in the solid-state imaging apparatus and the camera, being manufactured by simultaneously cutting out the light-receiving chip and the transparent protection plate, as a set.

According to the stated structure, only one process is required for cutting out a set of light-receiving chip and transparent protection plate. This is a reduction in number of processes, and also enables to easily obtain a clean cross section for a set of light-receiving chip and transparent protection plate.

In addition, in the solid-state imaging apparatus and the camera, the main surface has a light-receiving area in a central portion thereof, and a plurality of electrodes outside the light-receiving area, the transparent protection plate includes: a plurality of terminal pads formed on the other main surface that is different from the main surface; and a plurality of conductive members insulated from each other, each conductive member electrically connecting one of the electrodes with a corresponding one of the terminal pads.

According to the stated structures, it becomes possible to restrain the lengthwise/widthwise size of an entire solid-state imaging apparatus down to the lengthwise/widthwise size of a corresponding solid-state imaging device. In addition, the thickness of an entire solid-state imaging apparatus is also restrained down to substantially the summation of the thickness of the solid-state imaging device and the thickness of a corresponding transparent protection plate. As a result, the solid-state imaging apparatus will be much smaller, in size, than conventional solid-state imaging apparatuses.

In addition, in the solid-state imaging apparatus and the camera, a plurality of holes are provided through the transparent protection plate, the holes being provided in position that will not prevent light from traveling onto the light-receiving area, and part of each of the conductive members is positioned in a corresponding one of the holes.

In addition, in the solid-state imaging apparatus and the camera, the part of each of the conductive members that is positioned in the corresponding hole is a conductive foil attached to a side wall of the of the corresponding hole.

In addition, in the solid-state imaging apparatus and the camera, the part of each of the conductive members that is positioned in the corresponding hole is a conductive material filling the corresponding hole.

According to the stated structures, a hole is generated instead of a conventional bonding pad. Therefore, the designing is performed without any regard to the conventional designing rule that depends on the accuracy of a wire bonding apparatus, and the like.

As a result, it becomes possible to have expectations that the area of the light-receiving chip be reduced because the structures allow greater layout flexibility, which contributes to reduction in size and weight of a camera.

Furthermore, holes are provided for a sheet, which is a manufacturing advantage.

In addition, in the solid-state imaging apparatus and the camera, each of the conductive members is a conductive foil attached to the main surface, a side surface, and the other main surface of the transparent protection plate.

According to the stated structures, a conductive foil is provided on a side surface, instead of provision of a conventional bonding pad. Therefore the entire area of a bonding pad becomes unnecessary. Therefore, the designing is performed without any regard to the conventional designing rule that depends on the accuracy of a wire bonding apparatus, and the like.

Accordingly, it is possible to have expectations that the area of the light-receiving chip be reduced because the structures allow greater layout flexibility, which contributes to reduction in size and weight of a camera.

In addition, a camera according to the present invention is a solid-state imaging apparatus of claim 1; and a print wiring board having lands arranged to correspond, in position, to terminals of the solid-state imaging apparatus, where each of the terminals is flip-chip mounted directly to a corresponding one of the lands.

According to the stated structure, the thickness of a solid-state imaging apparatus is able to be restrained to substantially the summation of the thickness of a solid-state imaging device and the thickness of a transparent protection plate.

According to the manufacturing method of a solid-state imaging apparatus, the transparent protection plates are attached to the wafer, and then the resulting attached member is cut into respective chips, which contributes to great productivity improvement compared to conventional cases.

Accordingly, it becomes possible to reduce the price of a solid-state imaging apparatus, which further contributes to price reduction of a camera.

In addition, in the manufacturing method, for one solid-state imaging apparatus, a corresponding main surface is made up of a light-receiving area on which a set of light-receiving cells are arranged and a periphery area surrounding the light-receiving area, each of the transparent protection plates prepared in the protection-plate preparing step has a skirt portion at a periphery of the transparent protection plate, and in the attaching step, a corresponding set of light-receiving cells of a solid-state imaging apparatus is sealed airtight by a skirt portion of a corresponding transparent protection plate that is attached onto a corresponding periphery area, so as to form a space between the set of light-receiving cells and the transparent protection plate.

According to the stated structure, the distance between the light-receiving area and the transparent protection plate depends on the accuracy of the form of the light-receiving chip. Therefore, the distance hardly varies, which contributes to productivity improvement.

In addition, in the manufacturing method, each of the transparent protection plates is a flat plate made of glass or resin, and in the protection-plate preparing step, a corresponding skirt portion is created by plating metal on the periphery of each of the transparent protection plates.

In addition, in the manufacturing method, each of the transparent protection plates is a flat plate made of resin, and in the protection-plate preparing step, a corresponding skirt portion is created by pressing the flat resin plate.

According to the stated structures, manufacturing enables the distance between the light-receiving area and the transparent protection plate to be in the accuracy of about several μm.

In addition, in the manufacturing method, a wafer preparing step of preparing the semiconductor wafer of light-receiving chips, so that each light-receiving chip has a rib portion in a loop shape, where for each one solid-state imaging apparatus, a corresponding main surface is made up of a light-receiving area on which a set of light-receiving cells are arranged and a periphery area surrounding the light-receiving area, a rib portion being provided in the periphery area, and in the attaching step, the set of light-receiving cells is sealed airtight and a space is formed between the set of light-receiving cells and a corresponding transparent protection plate, as a result of a periphery of the transparent protection plate positioned on the rib portion.

According to the stated structure, the distance between the light-receiving area and the transparent protection plate depends on the accuracy of the form of the light-receiving chip. Therefore, the distance hardly varies, which contributes to productivity improvement.

In addition, in the manufacturing method, in the wafer preparing step, a rib portion of a corresponding light-receiving chip is made of an insulative material that is the same as a material of a protection foil.

According to the stated structure, manufacturing enables the distance between the light-receiving area and the transparent protection plate to be in the accuracy of about several μm.

Furthermore, rib-portion forming is performed in the diffusion process that is prior to the chip-cutting process, and so no extra process is required for the rib-portion forming, which contributes to productivity improvement.

In addition, in the manufacturing method, in the protection-plate preparing step, a sheet in which the plurality of transparent protection plates are linked together is prepared, in the attaching step, the sheet of the transparent protection plates is attached onto the plurality of light-receiving chips in the state of the semiconductor wafer, and in the cutting step, a light-receiving chip and a corresponding transparent protection plate is cut out as a set simultaneously.

According to the stated structure, only one process is required for cutting out a set of light-receiving chip and transparent protection plate. This is a reduction in number of processes, and also enables to easily obtain a clean cross section for a set of light-receiving chip and transparent protection plate.

BRIEF DESCRIPTION OF THE DRAWINGS

FIG. 11A is a diagram showing a sheet of solid-state imaging device 11, which is generated by Steps S1-S5 of the manufacturing method 1.

FIG. 11B is a diagram showing a sheet of transparent protection plate 12, which is generated by Step S6 of the manufacturing method 1.

FIG. 13A is a diagram showing a sheet of solid-state imaging device 11 generated in Steps S11-S15 of the manufacturing method 2.

FIG. 13B is a diagram showing a sheet of transparent protection sheet 12 generated in Step S16 of the manufacturing method 2.

FIG. 15A is a diagram showing the sheet of solid-state imaging device 11 generated in Steps S21-25 of the manufacturing method 3.

FIG. 15B is a diagram showing a sheet of transparent protection plate 12 generated in Step S26 of the manufacturing method 3.

FIG. 25A is a part of the plan view of the transparent protection plate 6, and FIG. 25B is a cross sectional view of the transparent protection plate 6 cut at the line C-C.

Figure 1:
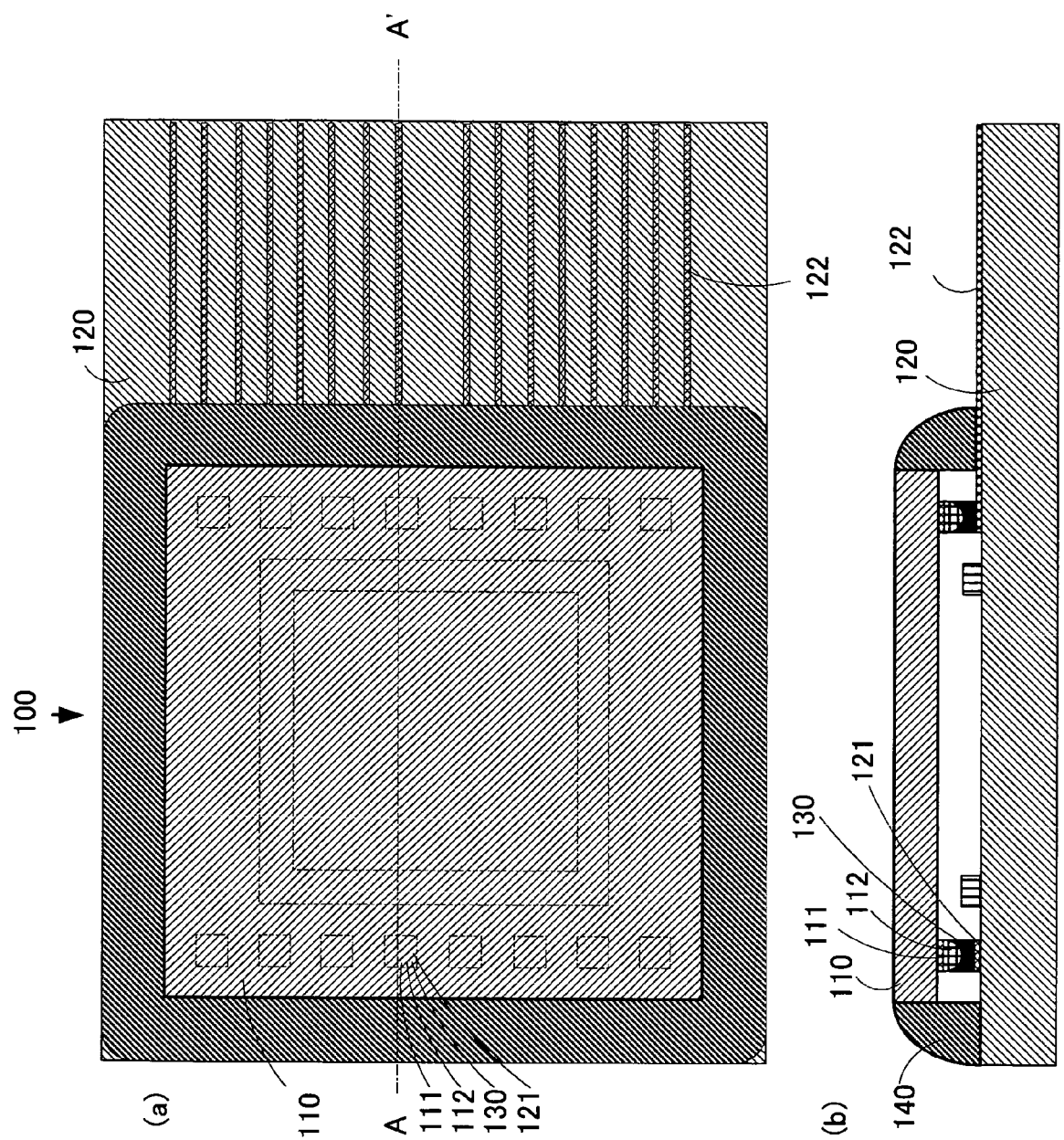
FIG. 1A is a plan view showing an overview of a conventional solid-state imaging apparatus 100 disclosed in the Patent Reference 1.
FIG. 1B is a diagram showing a cross sectional view of the solid-state imaging apparatus 100 of FIG. 1A, which is cut at the line of A-A'.

DESCRIPTION OF CHARACTERS 10 solid-state imaging apparatus
11 solid-state imaging device
11a insulation material
12 transparent protection plate
12a flat plate
12b metal
12c skirt portion
13 sealing material
14 base substrate
15 electrode
16 collective lens
17 through hole
18 light-receiving area
19 periphery area
20 space
21 hole
22 insulation material
23 input/output line
24 contact portion
25 conductive member
26 pad
27 filling material
30 solid-state imaging apparatus
31 solid-state imaging device
32 electrode
33 conductive member
40 solid-state imaging apparatus
41 solid-state imaging device
42 base substrate
43 electrode
44 side surface
45 conductive wire
46 insulation material
47 input/output line
48 contact portion
49 conductive member
50 pad
60 solid-state imaging apparatus
61 solid-state imaging device
62 transparent protection plate
63 sealing material
64 base substrate
65 electrode
66 collective lens
68 light-receiving area
69 periphery area
70 space
302 solid-state imaging apparatus
304 solid-state imaging device
306 transparent protection plate
308 terminal pad
309 vertical scanning circuit portion
310 light-receiving portion
311 horizontal scanning circuit portion
312 light-receiving area
313 timing generating circuit portion
314 electrode
315 peripheral circuit portion
316 concave portion
318 frame portion
320 conductive pad
322 hole
324 conductive foil
325 through hole
326 adhesive layer
328 wafer
330 transparent protection plate linkage member
332 conductive material
334 through hole
336 terminal pad
338 conductive pad
350 solid-state imaging apparatus
352 transparent protection plate
354 terminal pad
356 frame portion
358 conductive pad
360 conductive foil
370 print wiring board
372 land
374 window
380 digital camera
382 camera lens 384 A/D converter
386 CPU
388 DSP
390 work memory
392 chip
394 recording memory

BEST MODE FOR CARRYING OUT THE
INVENTION

Embodiment 1

<Structure>

Figure 3:
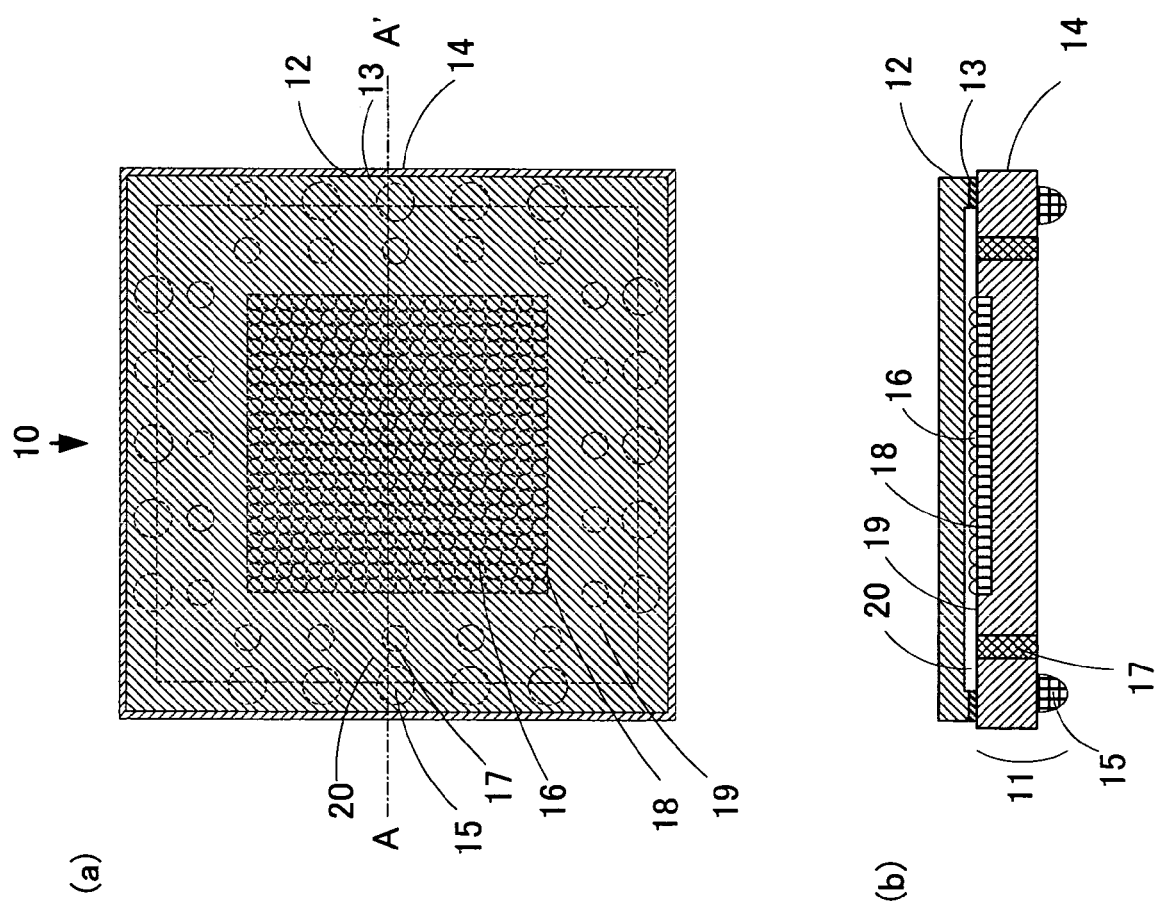
FIG. 3A is a plan view showing a solid-state imaging apparatus 10 according to the embodiment 1 of the present invention.
FIG. 3B is a diagram showing a sectional diagram of the solid-sate imaging apparatus 10, which is cut at the line A-A' of FIG. 3A.

FIG. 3A is a plan view showing a solid-state imaging apparatus 10 according to the embodiment 1 of the present invention.

FIG. 3B is a diagram showing a sectional diagram of the solid-sate imaging apparatus 10, which is cut at the line A-A' of FIG. 3A.

As FIGS. 3A and 3B show, the solid-state imaging apparatus 10 of the embodiment 1 is made up of a solid-state imaging device 11, a transparent protection plate 12, and a sealing material 13.

The solid-state imaging device 11 is a light-receiving chip such as a CCD chip and a MOS chip, for example. The solid-state imaging device 11 includes a base substrate 14, electrodes 15, collective lenses 16, and through holes 17.

The first main surface of the base substrate 14 is divided into a light-receiving area 18 and a periphery area 19 (the first main surface corresponds to the upper surface in FIG. 3B, and is hereinafter referred to as "light-receiving surface"). The light-receiving area 18 is provided with a plurality of light-receiving cells arranged either one dimensionally or two dimensionally, where each light-receiving cell corresponds to one pixel. The periphery area 19 is an area positioned around the periphery of the light-receiving area, into which circuits other than the light-receiving cells are integrated. In the present embodiment, light-receiving cells corresponding to 300,000 pixels are arranged two dimensionally in the light-receiving area.

On the light-receiving surface, a plurality of input/output lines are provided, including a power-source input line, input lines for various control signals, and an output line for an image signal. The base substrate 14 is conventionally a semiconductor substrate made of silicon. Areas of the base substrate 14 that are in contact with the electrodes 15, the through holes 17, the input/output lines, and the like are covered by an insulation material such as silicon oxide and silicon nitride.

The electrodes 15 are formed on the second main surface of the base substrate 14 in the vicinity of the through holes 17 for outside connection. An example of an electrode 15 is a bump. The second main surface is positioned at the back of the light-receiving surface (the lower surface in FIG. 3B) and so is hereinafter referred to as "back surface". The electrodes 15 are used to connect to corresponding terminals of a circuit substrate in mounting the solid-state imaging apparatus 10 to the circuit substrate.

Each of the collective lenses 16 is provided on the light-receiving area 18, and functions to collect a projected image on the light-receiving area 18 by means of a corresponding light-receiving cell. The collective lenses 16 enhance light-receiving sensitivity.

The through holes 17 are respectively a conductive member electrically connecting the light-receiving surface and the back surface. The through holes 17 are insulated one from another, and each insulated through hole 17 connects a corresponding one of the input/output lines to a corresponding one of the electrodes 15.

Here, the number of the electrodes 15 and the number of the through holes 17 are respectively equal to the number of the input/output lines provided on the light-receiving surface. In the present embodiment, there are twenty electrodes 15, twenty through holes 17, and twenty input/output lines.

The transparent protection plate 12 is made of glass or acrylic resin, for example, which is able to transmit incident light without considerably changing the optical characteristics of the incident light. The transparent protection plate 12 is attached to the base substrate to entirely cover the light-receiving cells. The transparent protection plate 12 functions to protect the light-receiving area 18 and the collective lenses 16 of the solid-state imaging device 11 from physical damage and from dust. It should be noted here that the area of the transparent protection plate 12 may be equal to or smaller than the area of the solid-state imaging device 11. In the present embodiment, the transparent protection plate 12 and the solid-state imaging device 11 have substantially the equal area.

The sealing material 13 fixes, at the periphery area 19, the base substrate 14 and the transparent protection plate 12.

Here, the transparent protection plate 12 has a periphery portion that is thick and is in a loop shape (hereinafter "skirt portion"). As a result, the transparent protection plate 12 has such a concave shape that the part thereof covering the light-receiving area 18 is recessed with respect to the part thereof corresponding to the periphery area 19. The skirt portion of the transparent protection plate 12 is attached to the periphery area 19 by means of the sealing material 13, thereby sealing the light-receiving cells airtight and forming a space 20 between the collective lenses 16 and the transparent protection plate 12. Alternatively, the solid-state imaging device 11 may have a protrusion having a loop shape, in the periphery area 19 (the loop-shaped protrusion being hereinafter referred to as "rib portion"), so that the periphery area 19 protrudes with respect to the light-receiving area 18. In this case, the periphery of the transparent protection plate 12 is attached to the rib portion of the solid-state imaging device 11 by means of the sealing material 13, thereby sealing the light-receiving cells airtight and forming the space 20 between the collective lenses 16 and the transparent protection plate 12.

Furthermore, the index of refraction of the space 20 is smaller than the index of refraction of the collective lens 16.

For example, when for example a resin material having an index of refraction of about 1.5 is adopted for the collective lens 16, it is desirable that the index of refraction for the space 20 is about 1.0. Here, the space 20 is filled with air or inert gas. Alternatively the space 20 may be in a vacuum state, in a sense that the space 20 is under pressure lower than atmospheric pressure.

In addition, the collective lenses 16 may be made of a material having an index of refraction of about 2.0 or more, and the space 20 may be filled with resin having an index of refraction of about 1.5, for example.

In addition, the air with which the space 20 is filled should desirably be dry air, and the inert gas is specifically helium, neon, argon, nitride, a mixture of them, and the like.

Regarding the space 20, the minimum size for the distance between the collective lenses 16 and the transparent protection plate 12 is "α" that only takes into account accuracy such as variation of components and production accuracy. As a result, the distance between the base substrate 14 and the transparent protection plate 12 will be "thickness of collective lens 16+α", which is equal to or smaller than the height of a bonding wire, which would be required for preventing interference with a bonding wire in a conventional type that uses a bonding wire. Specifically, it is sufficient that "α" is several ten times of the accuracy such as variation of components and production accuracy. For example, when the accuracy is about several μm, then the value of "a" may be about several 10 μm-100 μm.

The following explains a concrete example showing how to enable a distance between the base substrate 14 and the transparent protection plate 12 to be "thickness of collective lens 16+α".

Figure 4:
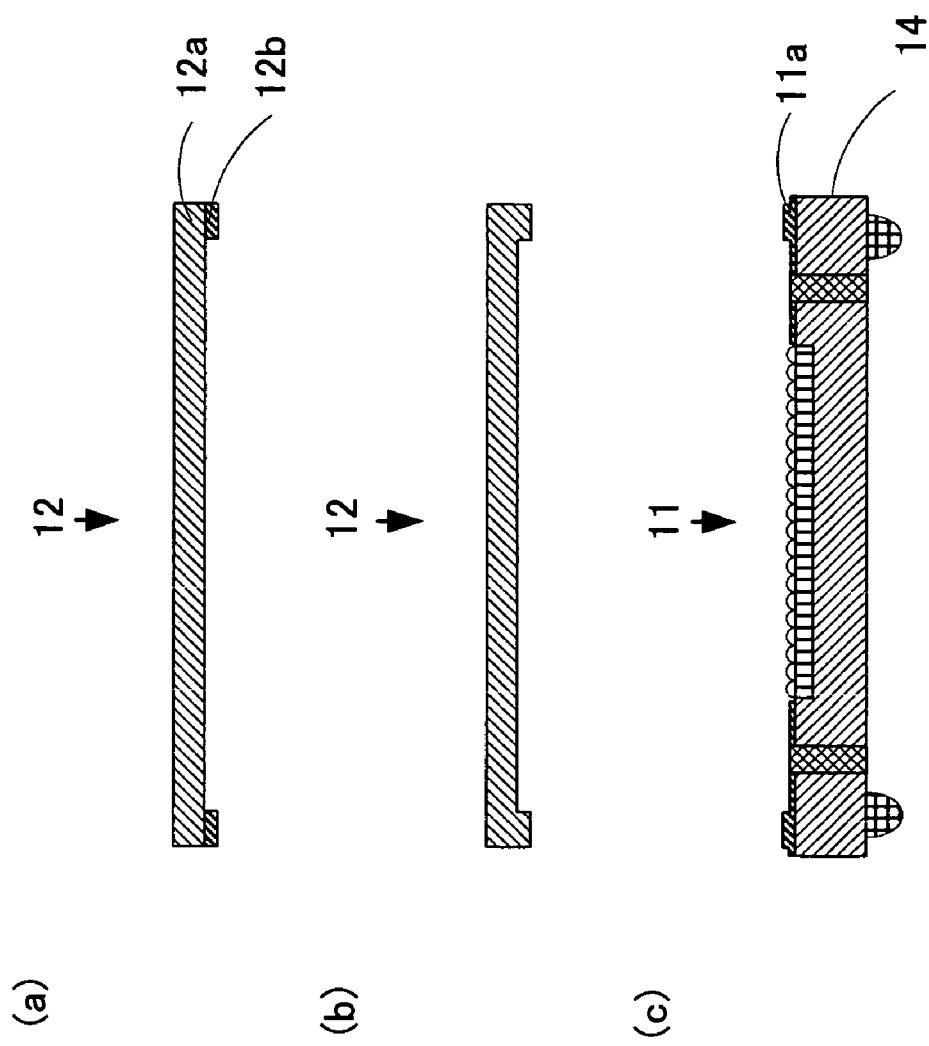
FIG. 4A is a diagram showing a sectional view of a transparent protection plate 12 that results by forming, using a plating method, a skirt portion (metal 12b) to a periphery portion of a flat plate 12a made of glass or acrylic resin, and the like. As shown in this drawing, the periphery portion of the transparent protection plate 12 is thicker than the central portion thereof by "thickness of collective lens 16+α".
FIG. 4B is a diagram showing a sectional view of a transparent protection plate 12 that results by forming a skirt portion by subjecting acrylic resin and the like to press forming, so that the periphery portion of the transparent protection plate 12 is thicker than the central portion thereof by "thickness of collective lens 16+α".

FIG. 4A is a diagram showing a sectional view of a transparent protection plate 12 that results by forming, using a plating method, a skirt portion (metal 12b) to a periphery portion of a flat plate 12a made of glass or acrylic resin, and the like. As shown in this drawing, the periphery portion of the transparent protection plate 12 is thicker than the central portion thereof by "thickness of collective lens 16+α".

FIG. 4B is a diagram showing a sectional view of a transparent protection plate 12 that results by forming a skirt portion by subjecting acrylic resin and the like to press forming, so that the periphery portion of the transparent protection plate 12 is thicker than the central portion thereof by "thickness of collective lens 16+α".

FIG. 4C is a diagram showing a sectional view of a solid-state imaging device 11 whose periphery area 19 is provided with a rim portion, thereby causing the periphery portion of the solid-state imaging device 11 to be thicker than the central portion by "thickness of collective lens 16+α". The rim portion is formed in the diffusion process, using an insulation material 11a that is the same material as used for a protection foil such as a nitride foil and an oxide foil.

In the transparent protection plates 12 respectively of FIGS. 4A and 4B, and in the solid-state imaging device 11 of FIG. 4C, it is possible to enable a distance between the solid-state imaging device 11 and the transparent protection plate 12 to be "thickness of collective lens 16+α", by fixing a base substrate 14 and a transparent protection plate 12 at the periphery area 19 by means of the sealing material 13. Note that any combination of the FIGS. 4A-4C is also possible. It is also possible to make the distance shorter, by take into consideration the thickness of the sealing material 13. Still further, it is also possible to generate "thickness of collective lens 16+α" by means of only the thickness of the sealing material 13.

An image formed by an image-forming lens (not illustrated) is projected onto the light-receiving area 18 after being transmitted through the transparent protection plate 12 and the space 20. Then the projected image is collected by means of the collective lenses 16 to be subjected to photoelectric conversion by means of each light-receiving cell. As a result, the solid-state imaging device 11 outputs an image signal.

Figure 5:
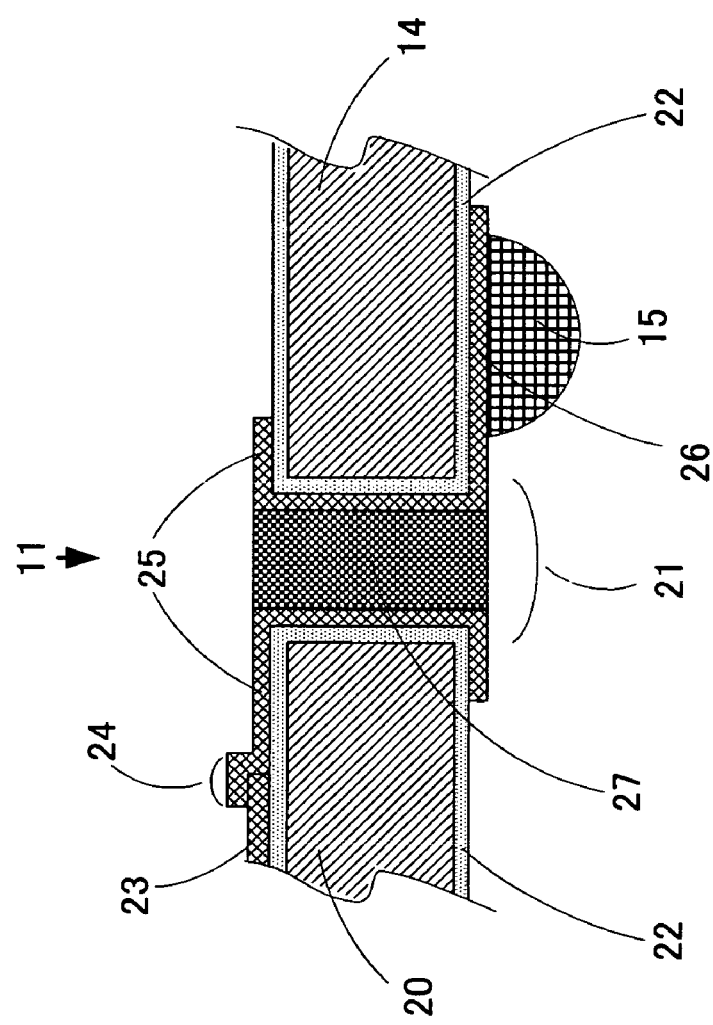
FIG. 5 is a diagram showing a sectional view of the solid-state imaging device 11 in the vicinity of one of the through holes 17.

FIG. 5 is a diagram showing a sectional view of the solid-state imaging device 11 in the vicinity of one of the through holes 17.

As FIG. 5 shows, a hole 21 is provided through the base substrate 14, and both main surfaces of the base substrate 14 and the inside the hole 21 are coated with an insulation material 22. Furthermore, the input/output line 23 provided up to the vicinity of the hole 21 on the light-receiving surface (upper surface of FIG. 5) is electrically connected to the conductive member 25 at a contact portion 24. The conductive member 25 is provided through the base substrate 14 by penetrating through the hole 21 from the light-receiving surface to the back surface of the base substrate 14 (lower surface of FIG. 5), to form a pad 26 for an electrode 15. The hole 21 is filled with a filling material 27, and the electrode 15 is formed on the pad 26 formed on the back surface.

Here, instead of the filling material 27, a conductive member 25 may be used to fill the entire hole.

MODIFICATION EXAMPLE 1

The modification example 1 of the present invention is different from the above-described embodiment 1, in the position of the electrodes. The other parts are the same as those in the embodiment 1.

Figure 6:
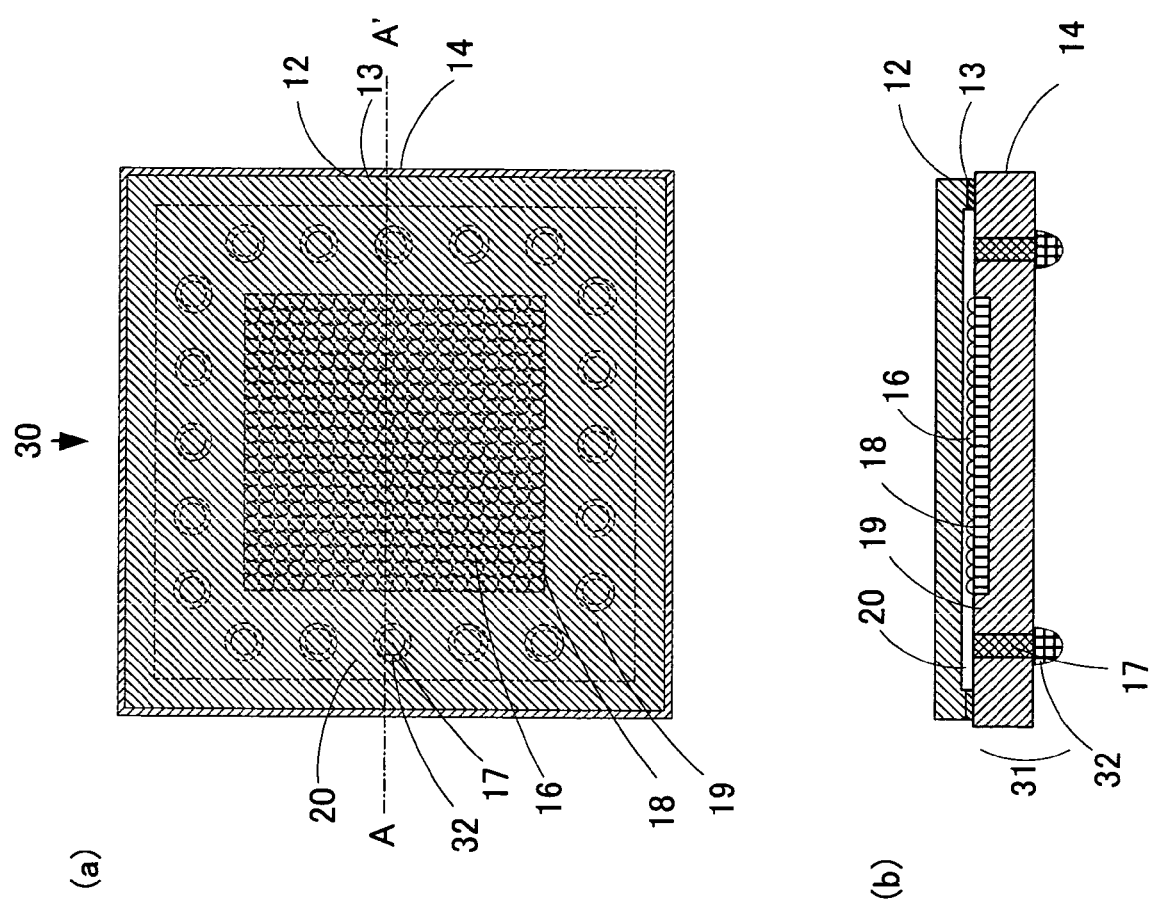
FIG. 6A is a plan view showing a solid-state imaging apparatus 30 according to the modification example 1 of the present invention.
FIG. 6B is a diagram showing a sectional view of the solid-state imaging apparatus 30 which is cut at the line A-A' of FIG. 6A.

FIG. 6A is a plan view showing a solid-state imaging apparatus 30 according to the modification example 1 of the present invention.

FIG. 6B is a diagram showing a sectional view of the solid-state imaging apparatus 30 which is cut at the line A-A' of FIG. 6A.

As FIGS. 6A and 6B show, the solid-state imaging apparatus 30 according to the modification example 1 is made up of a solid-state imaging device 31, a transparent protection plate 12, and a sealing material 13.

The solid-state imaging device 31 is a light-receiving chip such as a CCD chip and a MOS chip, for example, just as in the embodiment 1. The solid-state imaging device 31 includes a base substrate 14, electrodes 32, collective lenses 16, and through holes 17. In the solid-state imaging device 31, the electrodes 32 are on the back surface and immediately above the through holes 17, unlike in the solid-state imaging device 11 of the embodiment 1, and the structure in the vicinity of the through holes 17 is different from in the case of the solid-state imaging device 11 of the embodiment 1.

Note that the structural elements that are the same as the structural elements of the embodiment 1 are assigned the same reference numbers, and explanation thereof is omitted in the following description.

Each of the electrodes 32 for outside connection is formed on the back surface above a corresponding one of the through holes 17. An example of an electrode 32 is a bump. Just as the electrodes 15 in the embodiment 1, the electrodes 32 are used to connect to corresponding terminals of a circuit substrate in mounting the solid-state imaging apparatus 30 to the circuit substrate.

Here, the number of the electrodes 32 is the same as the number of the through holes 17 and the number of the input/output lines provided on the light-receiving surface respectively. In the present modification example, there are twenty electrodes 32, twenty through holes 17, and twenty input/output lines.

Figure 7:
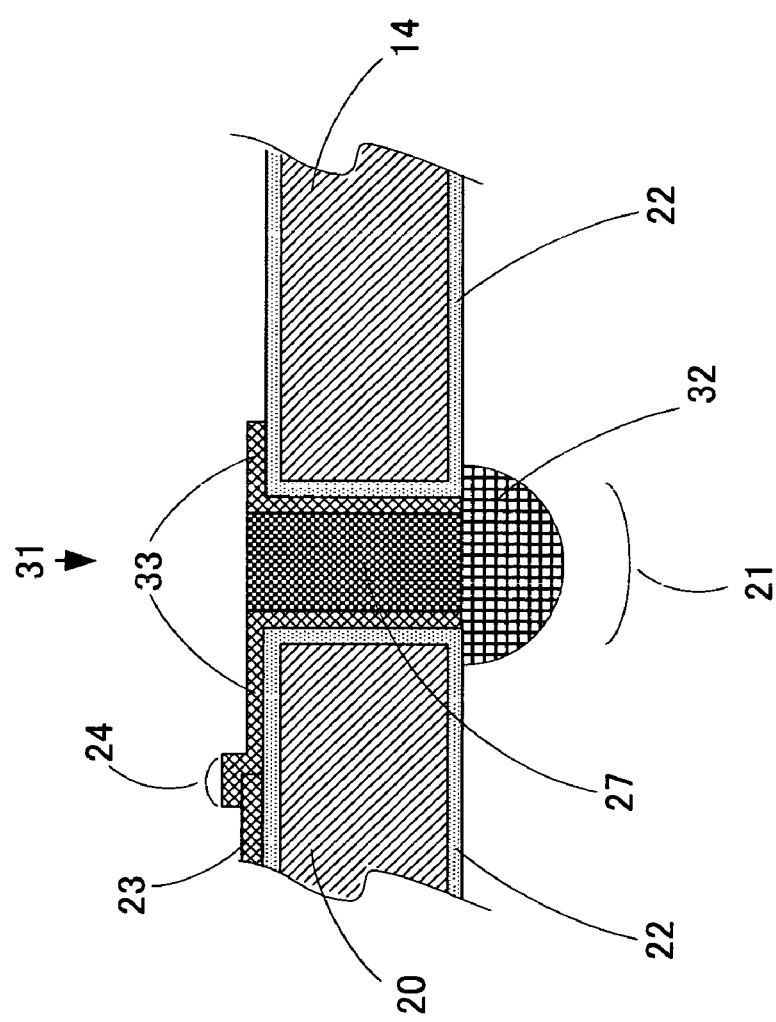
FIG. 7 is a diagram showing a detailed sectional view of the solid-state imaging device 31 in the vicinity of one of the through holes 17, according to the modification example 1 of the present invention.

FIG. 7 is a diagram showing a detailed sectional view of the solid-state imaging device 31 in the vicinity of one of the through holes 17, according to the modification example 1 of the present invention.

As FIG. 7 shows, a hole 21 is provided through the base substrate 14 made of silicon, and both main surfaces of the base substrate 14 and the inside the hole 21 are coated with an insulation material 22. Furthermore, the input/output line 23 provided up to the vicinity of the hole 21 on the light-receiving surface (upper surface of FIG. 7) is electrically connected to the conductive member 33 at a contact portion 24. The conductive member 33 is provided through the base substrate 14 by penetrating through the hole 21 from the light-receiving surface to the back surface of the base substrate 14 (lower surface of FIG. 7). The hole 21 is filled with a filling material 27, and the electrode 32 is formed on the back surface and above the hole 21.

MODIFICATION EXAMPLE 2

The modification example 2 of the present invention is different from the embodiment 1 in that the through holes 17 are replaced by conductive wires provided at side surfaces of the solid-state imaging device. The other parts are the same as those in the embodiment 1.

Figure 8:
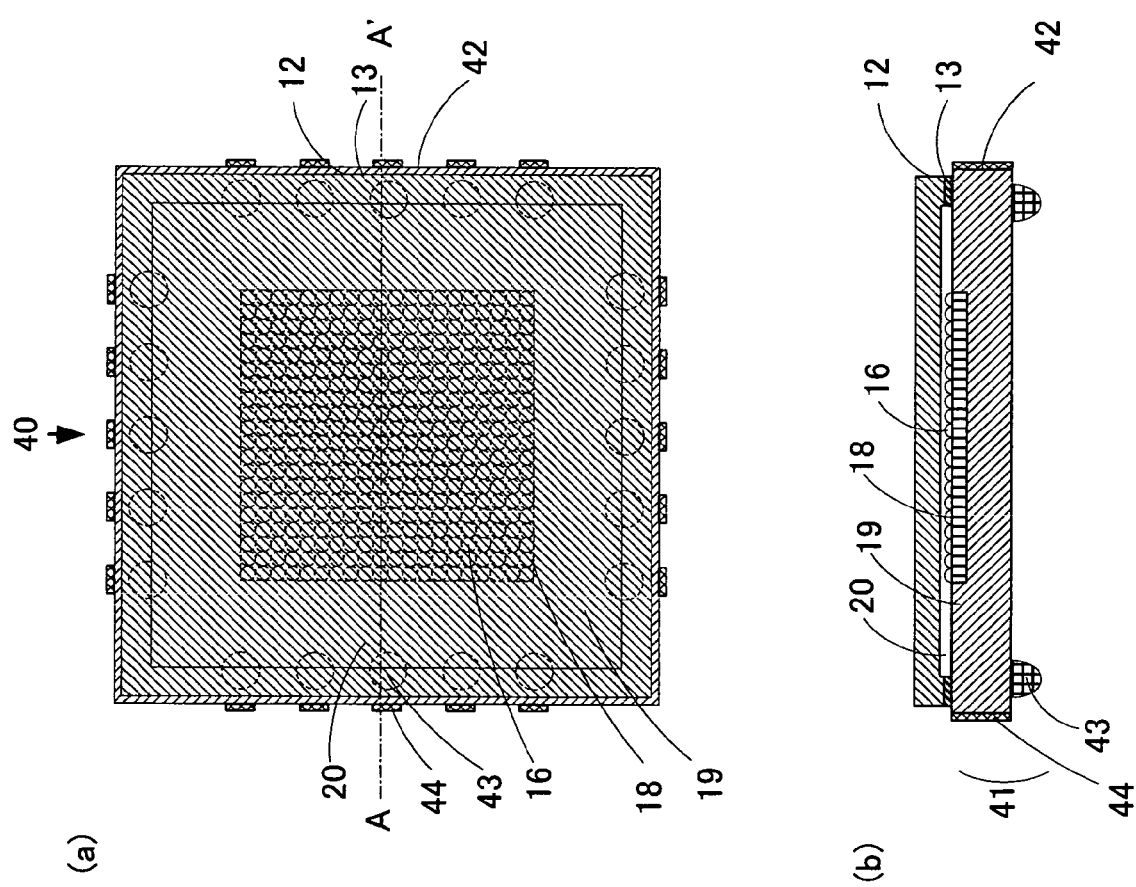
FIG. 8A is a plan view showing a solid-state imaging apparatus 40 according to the modification example 2 of the present invention.
FIG. 8B is a diagram showing a sectional view of the solid-state imaging apparatus 40 which is cut at the line A-A' of FIG. 8A.

FIG. 8A is a plan view showing a solid-state imaging apparatus 40 according to the modification example 2 of the present invention.

FIG. 8B is a diagram showing a sectional view of the solid-state imaging apparatus 40 which is cut at the line A-A' of FIG. 8A.

As FIGS. 8A and 8B show, the solid-state imaging apparatus 40 according to the modification example 2 is made up of a solid-state imaging device 41, a transparent protection plate 12, and a sealing material 13.

The solid-state imaging device 41 is a light-receiving chip such as a CCD chip and a MOS chip, for example, just as in the embodiment 1. The solid-state imaging device 41 includes a base substrate 42, electrodes 43, collective lenses 16, and conductive wires 45.

Note that the structural elements that are the same as the structural elements of the embodiment 1 are assigned the same reference numbers, and explanation thereof is omitted in the following description.

The electrodes 43 for outside connection are formed on the back surface. An example of an electrode 43 is a bump. Just as the electrodes 15 in the embodiment 1, the electrodes 43 are used to connect to corresponding terminals of a circuit substrate in mounting the solid-state imaging apparatus 40 to the circuit substrate.

The conductive wires 45 are conductive members formed on the side surfaces of the base substrate 42, and are used to electrically connect the light-receiving surface to the back surface. The conductive wires 45 are insulated one from another, and each insulated conductive wire electrically connects a corresponding one of the input/output lines to a corresponding one of the electrodes 15.

Here, the number of the electrodes 43 and the number of the conductive wires 45 are equal to the number of the input/output lines provided on the light-receiving surface. In the present modification example, there are twenty electrodes 43, twenty conductive wires 45, and twenty input/output lines.

Figure 9:
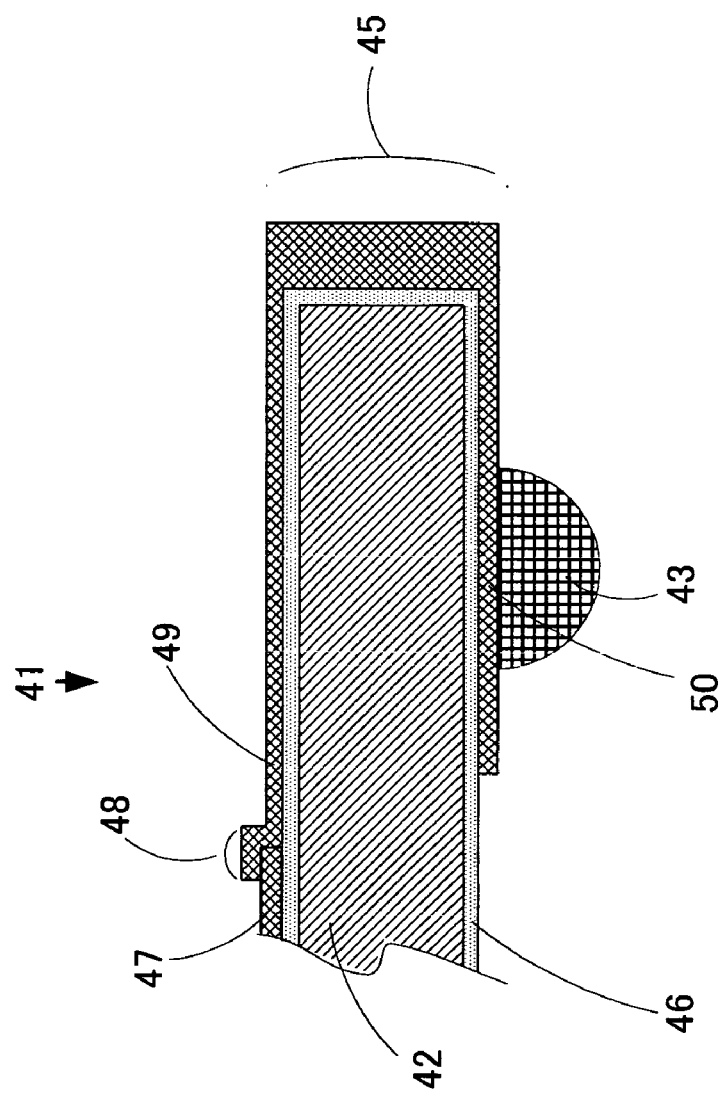
FIG. 9 is a diagram showing a detailed sectional view of the solid-state imaging device 41 in the vicinity of one of the conductive wires 45, according to the modification example 2 of the present invention.

FIG. 9 is a diagram showing a detailed sectional view of the solid-state imaging device 41 in the vicinity of one of the conductive wires 45, according to the modification example 2 of the present invention.

As FIG. 9 shows, both of the main surfaces and the side surfaces of the base substrate 42 are coated with an insulation material 46. Furthermore, the input/output line 47 provided on the light-receiving surface (upper surface of FIG. 9) up to the vicinity of the side surface 44 of the base substrate 42 is electrically connected to the conductive member 49 at a contact portion 48. The conductive member 49 is provided from the light-receiving surface via the side surface 44 up to the back surface (lower surface of FIG. 9) of the base substrate 42, to form a pad 50 for an electrode 43. The electrode 43 is formed on the pad 50 on the back surface.

<Manufacturing Method 1>

Figure 10:
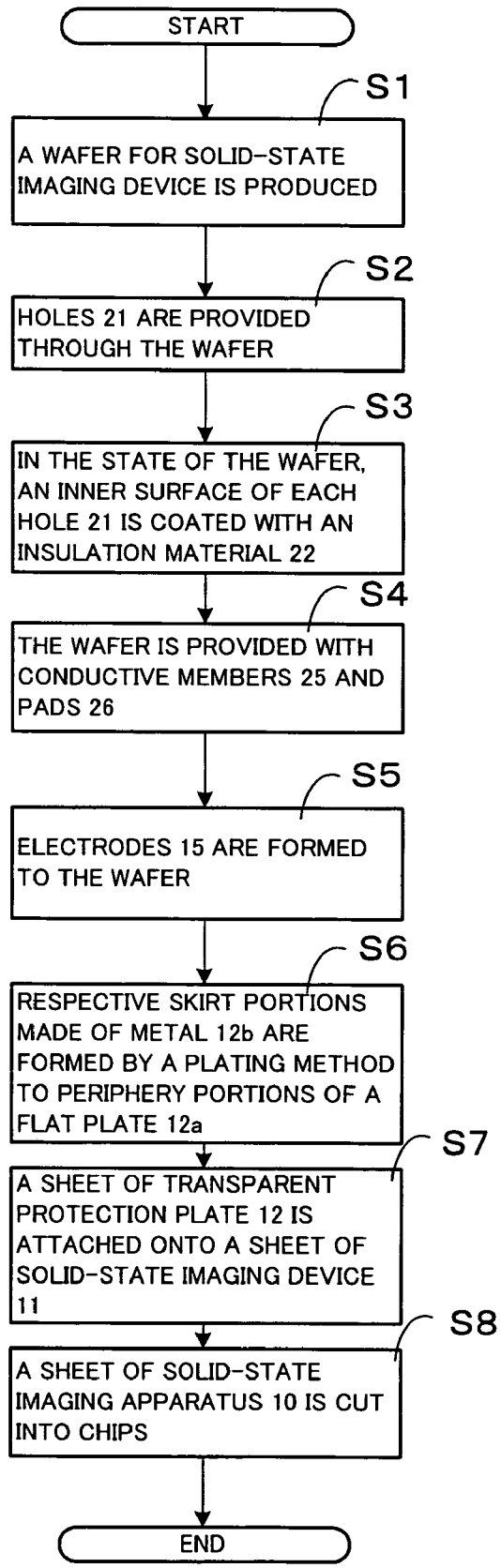
FIG. 10 is a diagram showing an overview of a manufacturing method of a solid-state imaging apparatus 10, in the case where the skirt portion of the transparent protection plate 12 is formed by a plating method (see FIG. 4A).

FIG. 10 is a diagram showing an overview of a manufacturing method of a solid-state imaging apparatus 10, in the case where the skirt portion of the transparent protection plate 12 is formed by a plating method (see FIG. 4A).

The following describes the overview of the manufacturing method of the solid-state imaging apparatus 10 with reference to FIG. 4A, FIG. 5, and FIG. 10.

(1) In a diffusion process, a semiconductor wafer is processed, thereby forming a wafer for solid-state imaging device (Step S1).

(2) Holes 21 are provided through the wafer (Step S2).

(3) To the wafer, an inner surface of each hole 21 is coated with an insulation material 22 (Step S3).

(4) The wafer is provided with conductive members 25 and pads 26 (Step S4).

(5) Electrodes 15 are formed to the wafer (Step S5).

As a result of the above wafer preparation process (Steps S1-S5), a sheet of solid-state imaging device 11 completes.

(6) Subsequently, in a protection-plate preparation process, respective skirt portions made of a metal 12b are formed by a plating method to periphery portions of a flat plate 12a made of glass or acrylic resin (Step S6).

As a result of the protection-plate preparation process of Step S6, a sheet of transparent protection plate 12 completes, which is made up of a plurality of transparent protection plates, each transparent protection plate having an area that is equal to or smaller than an area of one solid-state imaging device 11.

FIG. 11A is a diagram showing a sheet of solid-state imaging device 11, which is generated by Steps S1-S5 of the manufacturing method 1.

FIG. 11B is a diagram showing a sheet of transparent protection plate 12, which is generated by Step S6 of the manufacturing method 1.

As FIG. 11B shows, the sheet of transparent protection plate 12 has, at respective periphery portions, skirt portions made of the metal 12b. In contrast, the sheet of solid-state imaging device 11 is not provided with any protrusions, as FIG. 11A shows.

(7) Subsequently, in an attaching process (Step S7), the sheet of transparent protection plate 12 (resulting from Step S6) is attached onto the sheet of solid-state imaging device 11 (resulting from Steps S1-S5).

As a result of Step S7, a sheet of solid-state imaging apparatus 10 completes.

(8) Subsequently, in a cutting process, the sheet of solid-state imaging apparatus 10 generated in Step S7 is cut into chips (Step S8). In this example, a dicing saw is used to dice the sheet of solid-state imaging apparatus 10 into respective sets of solid-state imaging device 11 and transparent protection plate 12.

<Manufacturing Method 2>

Figure 12:
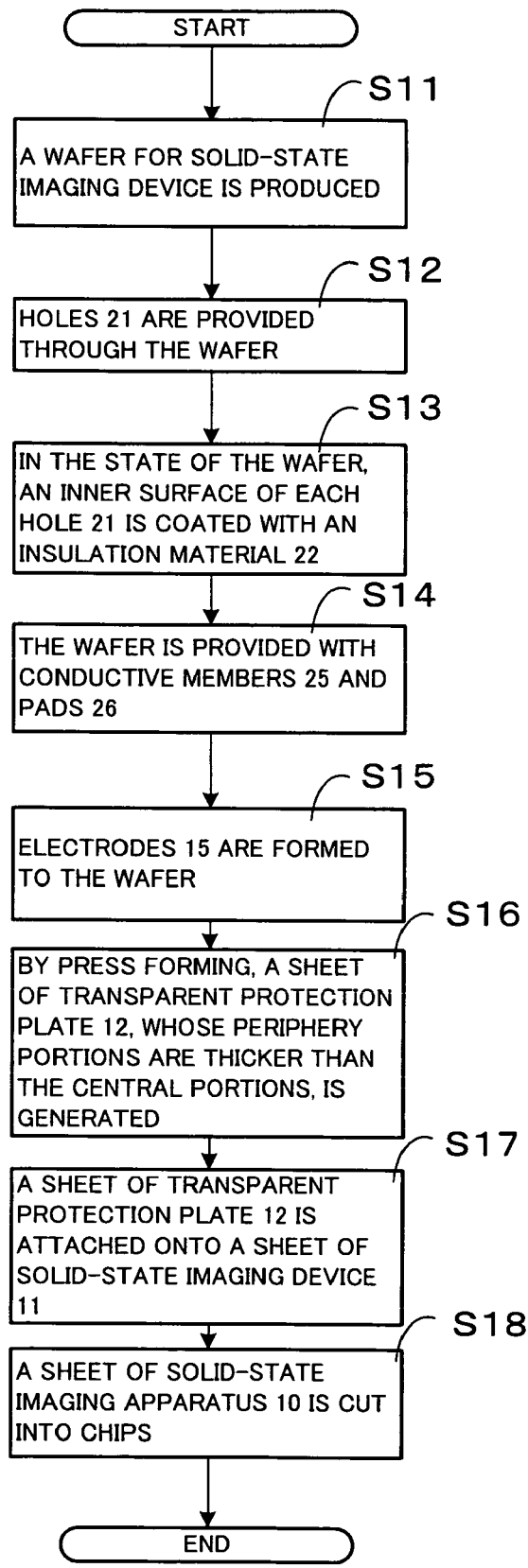
FIG. 12 is a diagram showing an overview of a manufacturing method of a solid-state imaging apparatus 10, in the case where the skirt portion of the transparent protection plate 12 is formed by subjecting acrylic resin and the like to press forming (See FIG. 4B).

FIG. 12 is a diagram showing an overview of a manufacturing method of a solid-state imaging apparatus 10, in the case where the skirt portion of the transparent protection plate 12 is formed by subjecting acrylic resin and the like to press forming (See FIG. 4B).

The following describes the overview of the manufacturing method of the solid-state imaging apparatus 10 with reference to FIG. 4B, FIG. 5, and FIG. 12.

(1) In a diffusion process, a semiconductor wafer is processed, thereby forming a wafer for solid-state imaging device (Step S11).

(2) Holes 21 are provided through the wafer (Step S12).

(3) To the wafer, an inner surface of each hole 21 is coated with an insulation material 22 (Step S13).

(4) The wafer is provided with conductive members 25 and pads 26 (Step S14).

(5) Electrodes 15 are formed to the wafer (Step S15).

As a result of the above wafer preparation process (Step S11-S15), a sheet of solid-state imaging device 11 completes.

(6) Subsequently, in a protection-plate preparation process, respective skirt portions are formed by subjecting a sheet made of acrylic resin and the like to press forming, so as to complete a sheet of transparent protection plate 12, which is made up of a plurality of transparent protection plates, each transparent protection plate having an area that is equal to or smaller than an area of one solid-state imaging device 11, and whose periphery portions are thicker than the central portions (Step S16).

(7) Subsequently, in an attaching process (Step S17), the sheet of transparent protection plate 12 (resulting from Step S16) is attached onto the sheet of solid-state imaging device 11 (resulting from Steps S11-S15).

As a result of Step S17, a sheet of solid-state imaging apparatus 10 completes.

FIG. 13A is a diagram showing a sheet of solid-state imaging device 11 generated in Steps S11-S15 of the manufacturing method 2.

FIG. 13B is a diagram showing a sheet of transparent protection sheet 12 generated in Step S16 of the manufacturing method 2.

As FIG. 13B shows, a skirt portion 12c is formed to each periphery portion of the sheet of transparent protection sheet 12. In contrast, the sheet of solid-state imaging device 11 is not provided with any protrusions, as FIG. 13A shows.

(8) Subsequently, in a cutting process, the sheet of solid-state imaging apparatus 10 generated in Step S17 is cut into chips (Step S18). In this example, a dicing saw is used to dice the sheet of solid-state imaging apparatus 10 into respective sets of solid-state imaging device 11 and transparent protection plate 12.

<Manufacturing Method 3>

Figure 14:
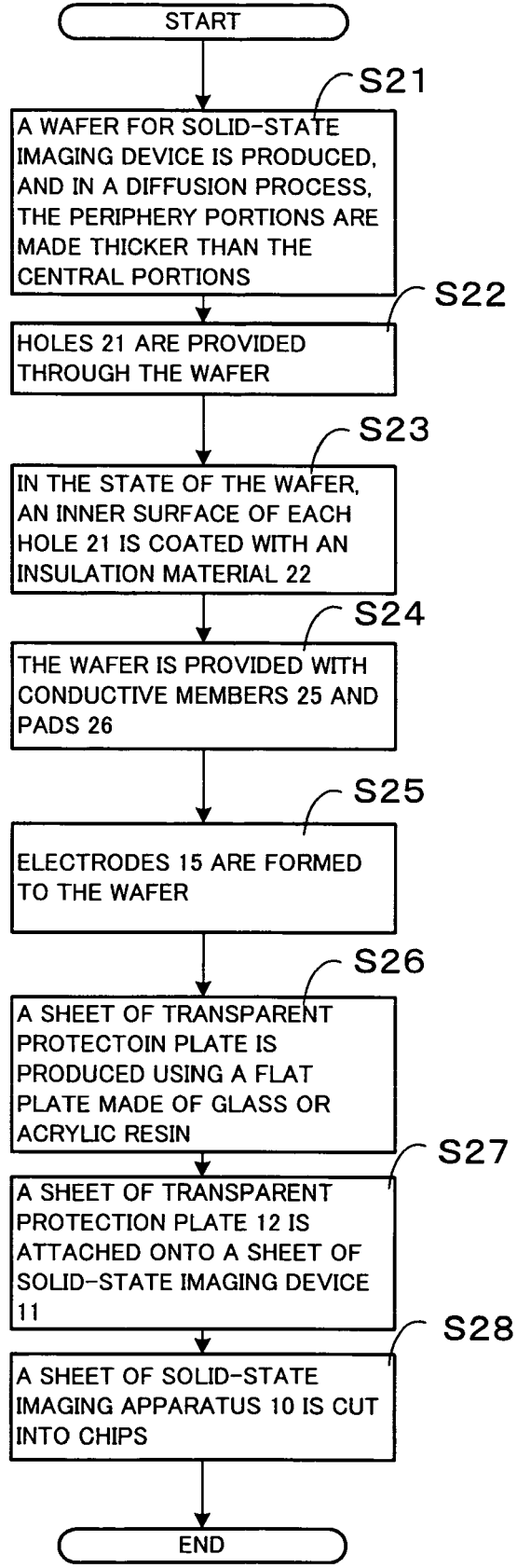
FIG. 14 is a diagram showing an overview of a manufacturing method of a solid-state imaging apparatus 10, in the case where the rib portion of the solid-state imaging device 11 is formed in the diffusion process.

FIG. 14 is a diagram showing an overview of a manufacturing method of a solid-state imaging apparatus 10, in the case where the rib portion of the solid-state imaging device 11 is formed in the diffusion process (see FIG. 4C).

The following describes the overview of the manufacturing method of the solid-state imaging apparatus 10 with reference to FIG. 4C, FIG. 5, and FIG. 14.

(1) In the diffusion process, a semiconductor wafer is processed, thereby forming a wafer for solid-state imaging device.

Here, in the diffusion process, rib portions are formed to periphery portions of the base substrate 14, respectively, by using an insulation material 11a that is the same material as used for a protection foil such as a nitride foil and an oxide foil. As a result, each periphery portion is made thicker than a corresponding central portion by collective lens 16+α" (Step S21).

(2) Holes are provided through the wafer (Step S22).

(3) To the wafer, an inner surface of each hole 21 is coated with an insulation material 22 (Step S23).

(4) The wafer is provided with conductive members 25 and pads 26 (Step S24).

(5) Electrodes 15 are formed to the wafer (Step S25).

As a result of above wafer preparation process (Steps S21-S25), a sheet of solid-state imaging device 11 completes.

(6) Subsequently, in a protection-plate preparation process, a flat plate made of glass, acrylic resin, and the like is used to form a sheet of transparent protection plate 12, which is made up of a plurality of transparent protection plates, each transparent protection plate having an area that is equal to or smaller than an area of one solid-state imaging device 11 (Step S26).

(7) Subsequently, in an attaching process (Step S27), the sheet of transparent protection plate 12 (resulting from Step S26) is attached onto the sheet of solid-state imaging device 11 (resulting from Step S27).

As a result of Step S27, a sheet of solid-state imaging apparatus 10 completes.

FIG. 15A is a diagram showing the sheet of solid-state imaging device 11 generated in Steps S21-25 of the manufacturing method 3.

FIG. 15B is a diagram showing a sheet of transparent protection plate 12 generated in Step S26 of the manufacturing method 3.

As FIG. 15A shows, rib portions are formed to respective periphery portions of the sheet of solid-state imaging device 11. In contrast, the sheet of transparent protection plate 12 is not provided with any thick portions, as FIG. 15B shows.

(8) Subsequently, in a cutting step, the sheet of solid-state imaging apparatus 10 generated in Step S27 is cut into chips (Step S28). In this example, a dicing saw is used to dice the sheet of solid-state imaging apparatus 10 into respective sets of solid-state imaging device 11 and transparent protection plate 12.

<Summary>

As stated above, according to the embodiment 1, the modification example 1, and the modification example 2 of the present invention, the input/output lines on the light-receiving surface are electrically connected to the electrodes for outside connection provided on the back surface. Therefore, input (e.g. an electric power or a control signal) from an external circuit substrate is received by the electrodes for outside connection provided on the back surface, and the received input is transferred to the input/output lines on the light-receiving surface, via the conductive member, so as to drive the solid-state imaging device. On the other hand, output (e.g. an image signal) from the solid-state imaging device conveyed via the input/output lines on the light-receiving surface and the conductive member to the electrodes for outside connection provided on the back surface, to be finally transferred to the external circuit substrate.

Accordingly, the area of the transparent protection plate is made equal to or smaller than the area of the light-receiving chip, which helps reduce the size and the weight of a camera to which the solid-state imaging apparatus of the present invention is to be mounted.

In addition, according to the embodiment 1, the modification example 1, and the modification example 2 of the present invention, the distance between the light-receiving chip and the transparent protection plate is made smaller than in the conventional cases. This creates a multiplier effect with the area reduction effect stated above, in reducing the size and weight of a camera to which the solid-state imaging apparatus of the present invention is to be mounted.

In addition, the embodiment 1, the modification example 1, and the modification example 2 of the present invention enable the productivity to considerably improve compared to conventional cases, because the entire area of the solid-state imaging apparatus is not larger than the area of the light-receiving chip, and so a wafer for light-receiving chip, as it is, is able to be attached to a sheet of transparent protection plates, before being cut into respective chips.

Furthermore, the distance between a transparent protection plate and a corresponding light-receiving area is designed to depend on the accuracy of the forms respectively of the transparent protection plate and the light-receiving chip. Accordingly, this distance will hardly vary, which contributes to productivity improvement.

Embodiment 2

<Structure>

Figure 16:
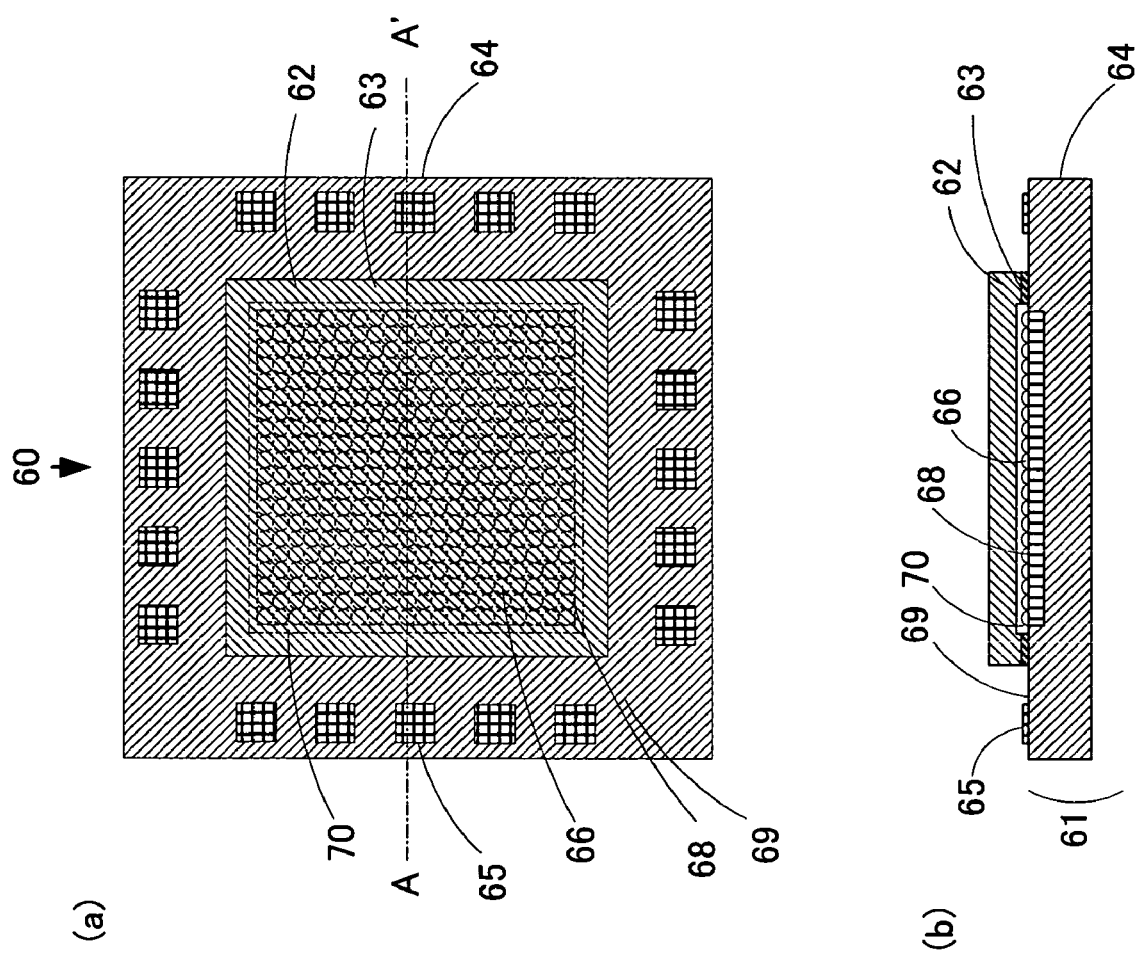
FIG. 16A is a plan view showing a solid-state imaging apparatus 60 according to the embodiment 2 of the present invention.
FIG. 16B is a diagram showing a sectional view of the solid-state imaging apparatus 60, which is cut at the line A-A' of FIG. 16A.

FIG. 16A is a plan view showing a solid-state imaging apparatus 60 according to the embodiment 2 of the present invention.

FIG. 16B is a diagram showing a sectional view of the solid-state imaging apparatus 60, which is cut at the line A-A' of FIG. 16A.

As FIGS. 16A and 16B show, the solid-state imaging apparatus 60 of the embodiment 2 is made up of a solid-state imaging device 61, a transparent protection plate 62, and a sealing material 63.

The solid-state imaging device 61 is a light-receiving chip such as a CCD chip and a MOS chip, for example. The solid-state imaging device 61 includes a base substrate 64, electrodes 65, and collective lenses 66.

The first main surface of the base substrate 64 is divided into a light-receiving area 68 and a periphery area 69 (the first main surface corresponds to the upper surface in FIG. 16B, and is hereinafter referred to as "light-receiving surface"). The light-receiving area 68 is provided with a plurality of light-receiving cells arranged either one dimensionally or two dimensionally, where each light-receiving cell corresponds to one pixel. The periphery area 69 is an area positioned around the periphery of the light-receiving area, into which circuits other than the light-receiving cells are integrated. In the present embodiment, light-receiving cells corresponding to 300,000 pixels are arranged two dimensionally in the light-receiving area.

On the light-receiving surface, a plurality of input/output lines are provided, including a power-source input line, input lines for various control signals, and an output line for an image signal.

The base substrate 64 is conventionally a semiconductor substrate made of silicon. Areas of the base substrate 64 that are in contact with the electrodes 65, the input/output lines, and the like are covered by an insulation material such as silicon oxide and silicon nitride.

The electrodes 65 for outside connection are formed on the periphery area 69 on the light-receiving surface of the base substrate 64. The electrodes 65 are used to connect to corresponding terminals of a circuit substrate in mounting the solid-state imaging apparatus 60 to the circuit substrate.

Each of the collective lenses 66 is provided on the light-receiving area 68, and functions to collect a projected image on the light-receiving area 68 by means of a corresponding light-receiving cell. The collective lenses 66 enhance light-receiving sensitivity.

Here, the number of the electrodes 65 is equal to the number of the input/output lines provided on the light-receiving surface. In the present embodiment, there are twenty electrodes 65 and twenty input/output lines.

The transparent protection plate 62 is made of glass or acrylic resin, for example, which is able to transmit incident light without considerably changing the optical characteristics of the incident light. The transparent protection plate 62 is attached to the base substrate 64 to entirely cover the light-receiving cells, without covering the electrodes 65 at all. The transparent protection plate 62 functions to protect the light-receiving area 68 and the collective lenses 66 of the solid-state imaging device 61 from physical damage and from dust. It should be noted here that the area of the transparent protection plate 62 is smaller than the area of the solid-state imaging device 61.

The sealing material 63 fixes, at the periphery area 69, the base substrate 64 and the transparent protection plate 62.

Here, the transparent protection plate 62 has a skirt portion at its periphery portion. As a result, the transparent protection plate 62 has such a concave shape that the part thereof covering the light-receiving area 68 is recessed with respect to the part thereof corresponding to the periphery area 69. The skirt portion of the transparent protection plate 62 is attached to the periphery area 69 by means of the sealing material 63, thereby sealing the light-receiving cells airtight and forming a space 70 between the collective lenses 66 and the transparent protection plate 62. Alternatively, the solid-state imaging device 61 may have a rib portion in the periphery area 69, so that the periphery area 69 protrudes with respect to the light-receiving area 68. In this case, the periphery of the transparent protection plate 62 is attached to the rib portion of the solid-state imaging device 61 by means of the sealing material 63, thereby sealing the light-receiving cells airtight and forming the space 70 between the collective lenses 66 and the transparent protection plate 62.

The characteristics of the space 70 is the same as those of the space 20 explained in the embodiment 1, and so detailed description thereof is omitted.

In addition, regarding the space 70, the distance between the collective lenses 66 and the transparent protection plate 62 is also identical to the distance between the collective lenses 16 and the transparent protection plate 12 regarding the space 20. Since the distance regarding the space 20 has already been discussed in the embodiment 1, and so discussion of the distance regarding the space 70 is accordingly omitted.

An image formed by an image-forming lens (not illustrated) is projected onto the light-receiving area 68 after being transmitted through the transparent protection plate 62 and the space 70. Then the projected image is collected by means of the collective lenses 66 to be subjected to photoelectric conversion by means of the light-receiving cells. As a result, the solid-state imaging device 61 outputs an image signal.

<Manufacturing Method 1>

Figure 17:
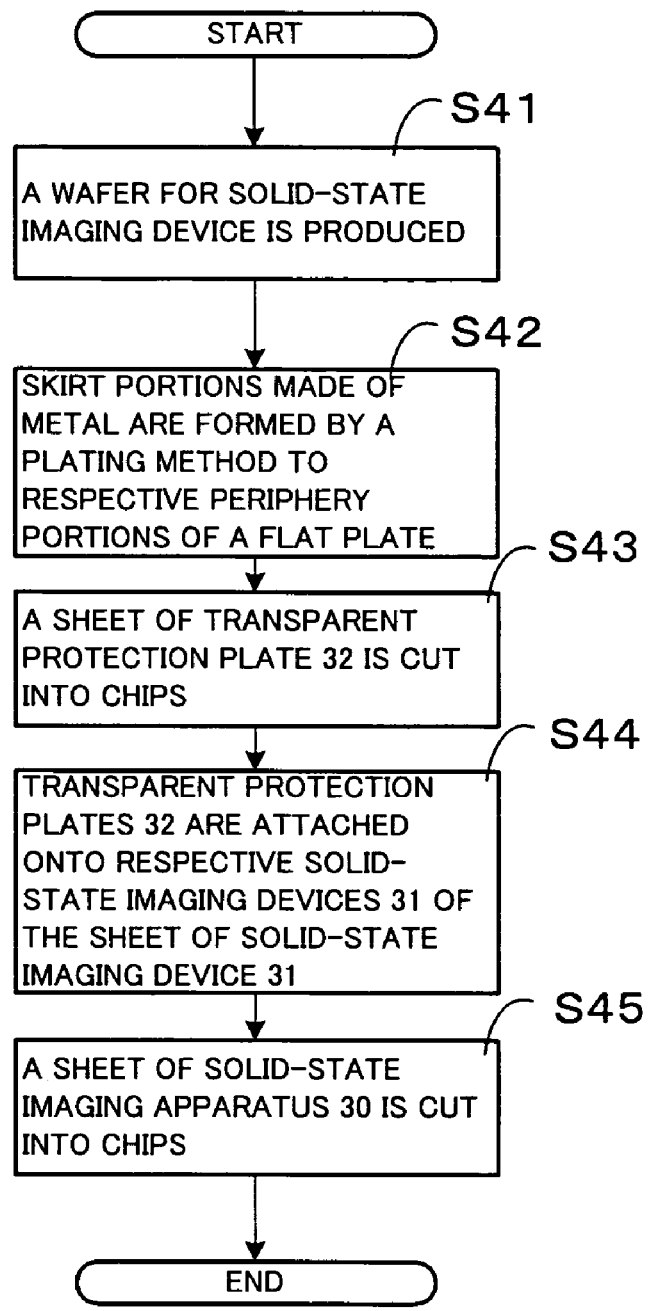
FIG. 17 is a diagram showing an overview of a manufacturing method of a solid-state imaging apparatus 60, in the case where the skirt portion of the transparent protection plate 62 is formed by a plating method.

FIG. 17 is a diagram showing an overview of a manufacturing method of a solid-state imaging apparatus 60, in the case where the skirt portion of the transparent protection plate 62 is formed by a plating method (See FIG. 4A).

The following describes the overview of the manufacturing method of the solid-state imaging apparatus 60 with reference to FIG. 17.

(1) In a diffusion process, a semiconductor wafer is processed, thereby forming a wafer for solid-state imaging device (Step S41).

As a result of this wafer preparation process of Step S41, a sheet of solid-state imaging device 61 completes.

(2) Subsequently, in a protection-plate preparation process, respective skirt portions made of metal are formed by a plating method to periphery portions of a flat plate made of glass or acrylic resin (Step S42).

As a result of the protection-plate preparation process of Step S42, a sheet of transparent protection plate 62 completes, which is made up of a plurality of transparent protection plates, each transparent protection plate having an area that is equal to or smaller than an area of one solid-state imaging device 61.

(3) Subsequently, in the first cutting process, the sheet of transparent protection plate 62 generated in Step S42 is cut into chips (Step S43).

(4) Subsequently, in an attaching process (Step S44), transparent protection plates 62 resulting from Step S42 are respectively attached onto solid-state imaging devices 61 of the sheet of solid-state imaging device 61 (resulting from Step S41).

As a result of Step S44, a sheet of solid-state imaging apparatus 60 completes.

(5) Subsequently, in the second cutting process, the sheet of solid-state imaging apparatus 60 generated in Step S44 is cut into chips (Step S45).

<Manufacturing Method 2>

Figure 18:
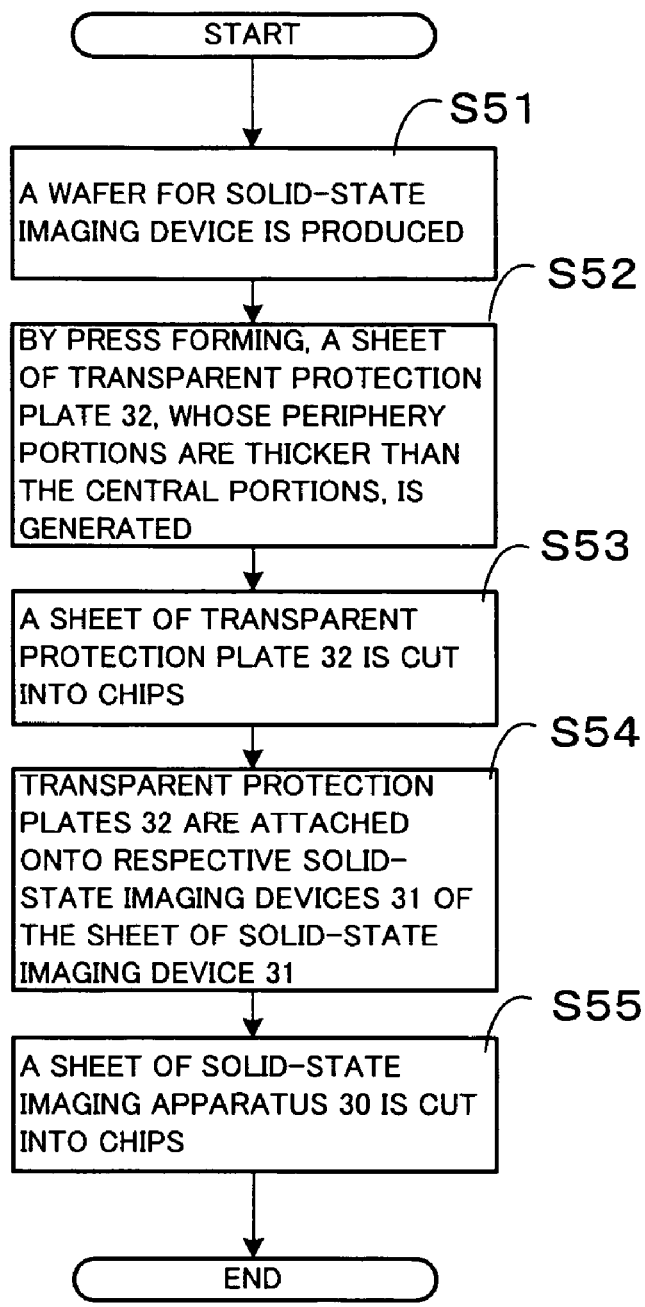
FIG. 18 is a diagram showing an overview of a manufacturing method of a solid-state imaging apparatus 60, in the case where the skirt portion of the transparent protection plate 62 is formed by subjecting acrylic resin and the like to press forming.

FIG. 18 is a diagram showing an overview of a manufacturing method of a solid-state imaging apparatus 60, in the case where the skirt portion of the transparent protection plate 62 is formed by subjecting acrylic resin and the like to press forming (See FIG. 4B).

The following describes the overview of the manufacturing method of the solid-state imaging apparatus 60 with reference to FIG. 18.

(1) In a diffusion process, a semiconductor wafer is processed, thereby forming a wafer for solid-state imaging device (Step S51).

As a result of this wafer preparation process of Step S51, a sheet of solid-state imaging device 61 completes.

(2) Subsequently, in a protection-plate preparation process, respective skirt portions are formed by subjecting a sheet made of acrylic resin and the like to press forming, so as to complete a sheet of transparent protection plate 62, which is made up of a plurality of transparent protection plates, each transparent protection plate having an area that is equal to or smaller than an area of one solid-state imaging device 61, and whose periphery portions are thicker than the central portions (Step S52).

(3) Subsequently, in the first cutting process, the sheet of transparent protection plate 62 generated in Step S52 is cut into chips (Step S53).

(4) Subsequently, in an attaching process (Step S54), transparent protection plates 62 (resulting from Step S53) are respectively attached onto solid-state imaging devices 61 of the sheet of solid-state imaging device 61 (resulting from Step S51).

As a result of Step S54, a sheet of solid-state imaging apparatus 60 completes.

(5) Subsequently, in the second cutting process, the sheet of solid-state imaging apparatus 60 generated in Step S54 is cut into chips (Step S55).

<Manufacturing Method 3>

Figure 19:
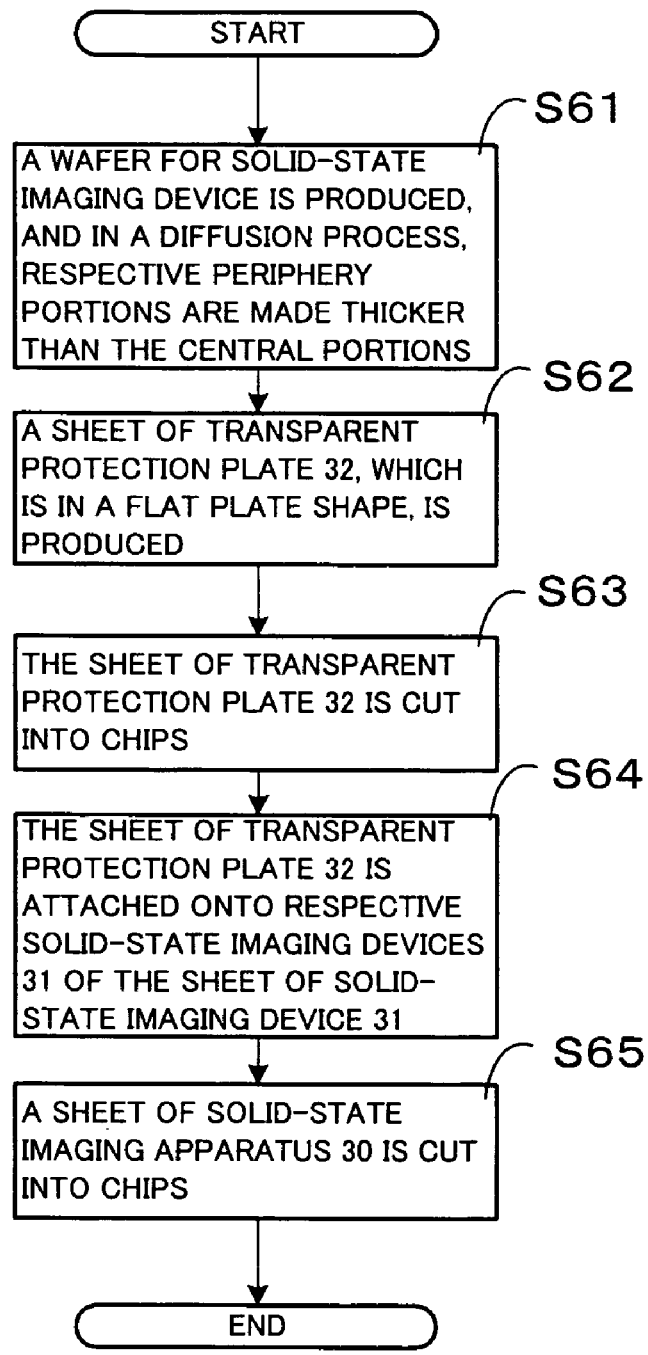
FIG. 19 is a diagram showing an overview of a manufacturing method of a solid-state imaging apparatus 60, in the case where the rib portion of the solid-state imaging device 61 is formed in the diffusion process.

FIG. 19 is a diagram showing an overview of a manufacturing method of a solid-state imaging apparatus 60, in the case where the rib portion of the solid-state imaging device 61 is formed in the diffusion process.

The following describes the overview of the manufacturing method of the solid-state imaging apparatus 60 with reference to FIG. 19.

(1) In a diffusion process, a semiconductor wafer is processed, thereby forming a wafer for solid-state imaging device.

Here, in the diffusion process, rib portions are formed to periphery portions of the base substrate 64, respectively, by using the same material as used for a protection foil such as a nitride foil and an oxide foil (Step S61).

As a result of this wafer preparation process of Step S61, a sheet of solid-state imaging device 61 completes.

(2) Subsequently, in a protection-plate preparation process, a flat plate made of glass, acrylic resin, and the like is used to form a sheet of transparent protection plate 62, which is made up of a plurality of transparent protection plates, each transparent protection plate having an area that is equal to or smaller than an area of one solid-state imaging device 61 (Step S62).

(3) Subsequently, in the first cutting process, the sheet of transparent protection plate 62 generated in Step S62 is cut into chips (Step S63).

(4) Subsequently, in an attaching process (Step S64), transparent protection plates 62 resulting from Step S63 are respectively attached onto solid-state imaging devices 61 of the sheet of solid-state imaging device 61 (resulting from Step S61).

As a result of Step S64, a sheet of solid-state imaging apparatus 60 completes.

(5) Subsequently, in the second cutting process, the sheet of solid-state imaging apparatus 60 generated in Step S64 is cut into chips (Step S65).

<Summary>

As stated above, the embodiment 2 of the present invention enables the productivity to considerably improve compared to conventional cases, because the entire area of the solid-state imaging apparatus is not larger than the area of the light-receiving chip, and so transparent protection plates are attached onto a wafer of light-receiving chip and then the resulting attached member is cut into respective chips.

Furthermore, the distance between a transparent protection plate and a corresponding light-receiving area is designed to depend on the accuracy of the forms respectively of the transparent protection plate and the light-receiving chip. Accordingly, this distance will hardly vary, which contributes to productivity improvement.

Embodiment 3

Figure 20:
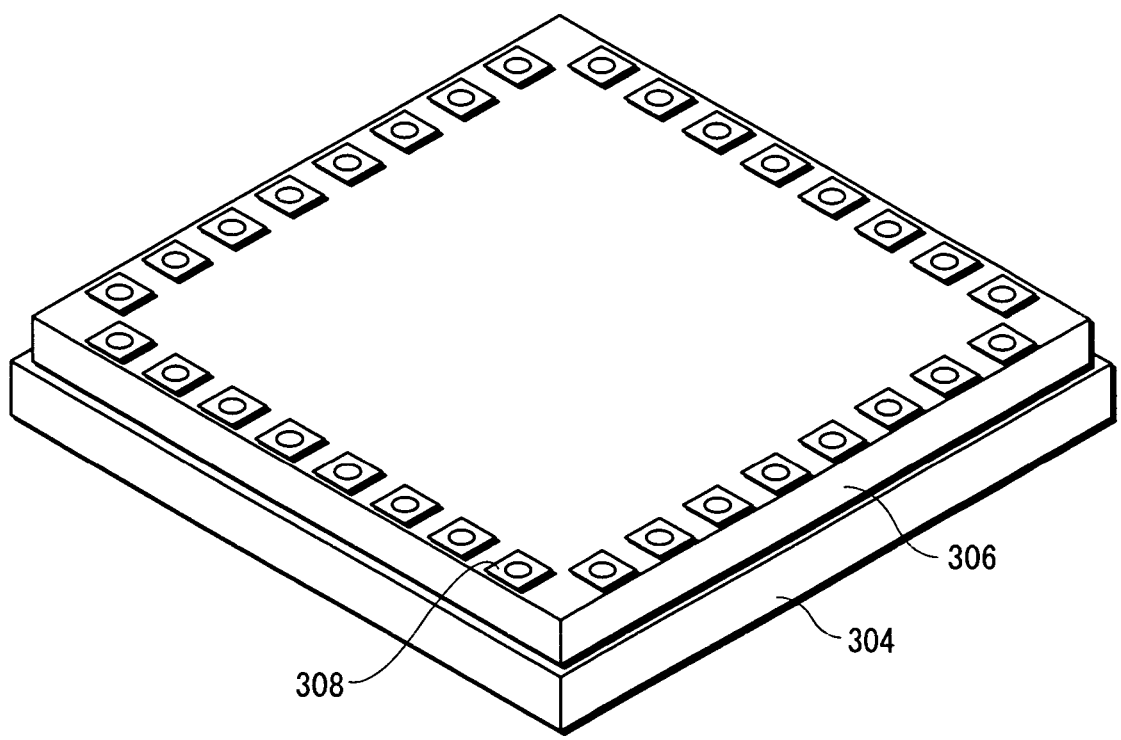
FIG. 20 is a perspective view showing an overall structure of a solid-state imaging apparatus 302 according to the embodiment 3.

FIG. 20 is a perspective view showing an overall structure of a solid-state imaging apparatus 302 according to the embodiment 3.

The solid-state imaging apparatus 302 is made up of a solid-state imaging device 304 and a transparent protection plate 306. The solid-state imaging device 304 has a substantially square plate shape, and the transparent protection plate 306 has a substantially square plate shape that is one size smaller than the square of the solid-state imaging device 304.

The solid-state imaging device 304 is a light-receiving chip produced by a semiconductor process and using a silicon substrate. In the present embodiment, a MOS-type image sensor chip is taken as an example of the solid-state imaging device 304. Note that the MOS-type image sensor chip is of a conventional type that is widely manufactured.

The transparent protection plate 306 is made of synthetic resin having transparent characteristics. An example of the synthetic resin is acryl. The transparent protection plate 306 is not limited to acryl, and other materials may be used as long as they do not considerably change the optical characteristics of incident light and have transparent characteristics. For example, the transparent protection plate 306 may be made of other synthetic resin, or glass. The transparent protection plate 306 is, on an upper surface thereof, provided with a plurality of terminal pads 308 (input-terminal pad or output terminal pad) for exchange of signals with external devices. Here, the upper surface corresponds to a main surface of the transparent protection plate 306 that is opposite to another main surface that faces the solid-state imaging device 304. The terminal pads 308 are made of gold (Au). The terminal pads 308 may alternatively be made of aluminum (Al).

Figure 21:
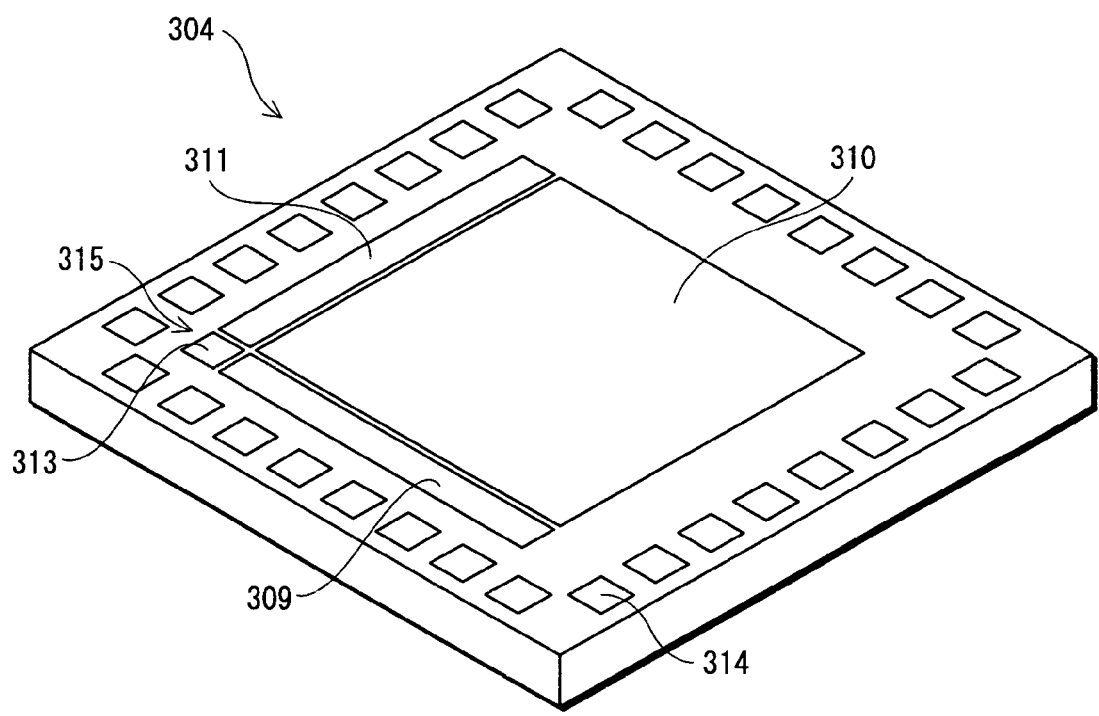
FIG. 21 is a perspective diagram showing an overall structure of the solid-state imaging device 304.

FIG. 21 is a perspective diagram showing an overall structure of the solid-state imaging device 304.

A light-receiving portion 310 is formed in the center of the upper surface of the solid-state imaging device 304. The light-receiving portion 310 is provided with pixels (not illustrated) arranged two dimensionally, where each pixel is composed of a photodiode and a vertical switch (MOS-type transistor). In addition, for each pixel (photodiode), a microlens is attached as a condenser (the microlens is not illustrated in the drawing).

Furthermore, the solid-state imaging device 304 includes a vertical scanning circuit portion 309, a horizontal scanning circuit portion 311, a timing generating circuit portion 313, and so on in its periphery around the light-receiving portion 310. These circuit portions are hereinafter collectively referred to as "a peripheral circuit portion 315".

In accordance with a timing signal emitted from the timing generating circuit portion 313, the vertical scanning circuit portion 309 turns on the vertical switch that corresponds to one line, thereby transferring the line of charge from among the charge having been accumulated in the photodiodes, to the horizontal scanning circuit portion 311. The horizontal scanning circuit portion 311 has a horizontal shift resistor (not illustrated), and is operable to output the received charge to outside via later-stated electrodes 314, after performing horizontal transfer on pixels one by one. The stated operation is repeated for each line until completing transfer of all the lines of charges. As a result, one frame of pixel charges is outputted.

The solid-state imaging device 304 is provided with a plurality of electrodes 314 on its periphery around the light-receiving portion 310, so as to apply input signal voltage required to operate the peripheral circuit portion 315 and to extract charges (output signal voltage) obtained by photoelectric conversion.

Figure 22:
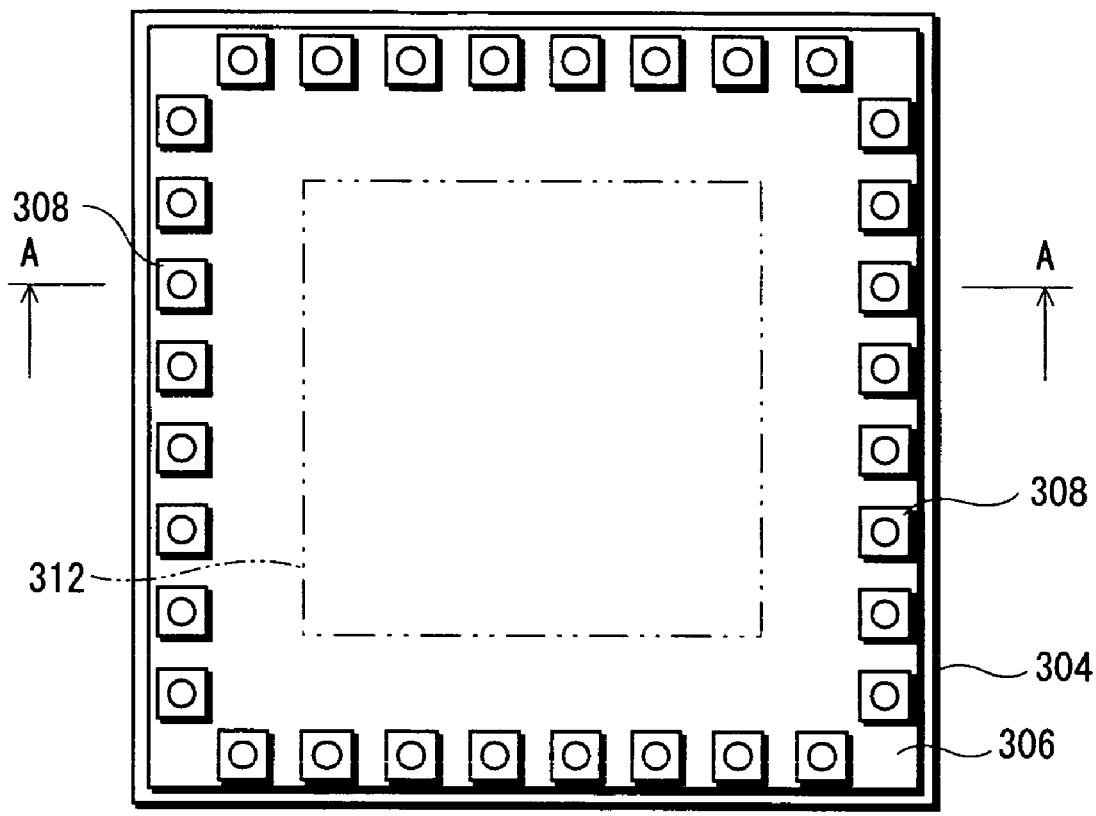
FIG. 22 is a plan view of the solid-state imaging apparatus 302.
Figure 23:
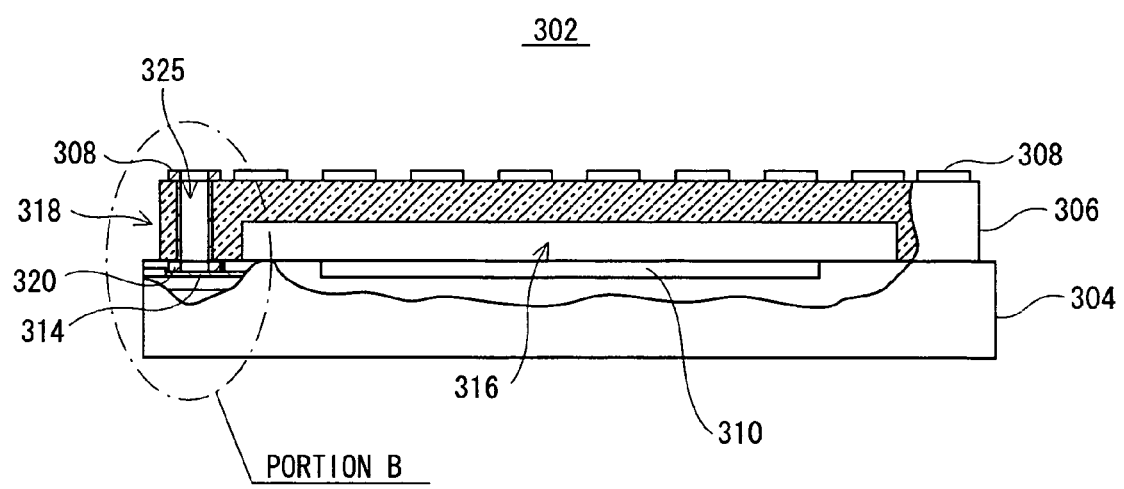
FIG. 23 is a sectional view of the solid-state imaging apparatus 302, which is cut at the line A-A.

FIG. 22 is a plan view of the solid-state imaging apparatus 302, and FIG. 23 is a sectional view of the solid-state imaging apparatus 302, which is cut at the line A-A.

Note that in FIG. 22, an area defined by a two-dot chain line corresponds to an area on which the light-receiving portion 310 is formed. Hereinafter, the area is referred to as "light-receiving area 312". The terminal pads 308 correspond to the electrodes 314 (FIG. 21) in one-to-one relation, in such a way that each terminal pad 308 is positioned immediately above a corresponding electrode 314. More specifically, each terminal pad 308 is placed in a position corresponding to a corresponding electrode 314 with the transparent protection plate 306 therebetween. In addition, as FIG. 22 shows, each terminal pad 308 is arranged in a position (area) on the periphery (four sides) of the transparent protection plate 306 so that the terminal pad 308 will not prevent light from traveling onto the light-receiving area 312.

As FIG. 23 shows, the transparent protection plate 306 has a concave portion 316 so as to create a space between the light-receiving portion 310 and the transparent protection plate 306 in the direction vertical to the light-receiving surface of the light-receiving portion 310 (the vertical direction corresponding to the direction in which the light travels). The purpose of forming the concave portion 316 is to enable the microlens to effectively exercise the light condensing function, by forming an air layer having a smaller index of refraction than that of the above-mentioned microlens.

Figure 24:
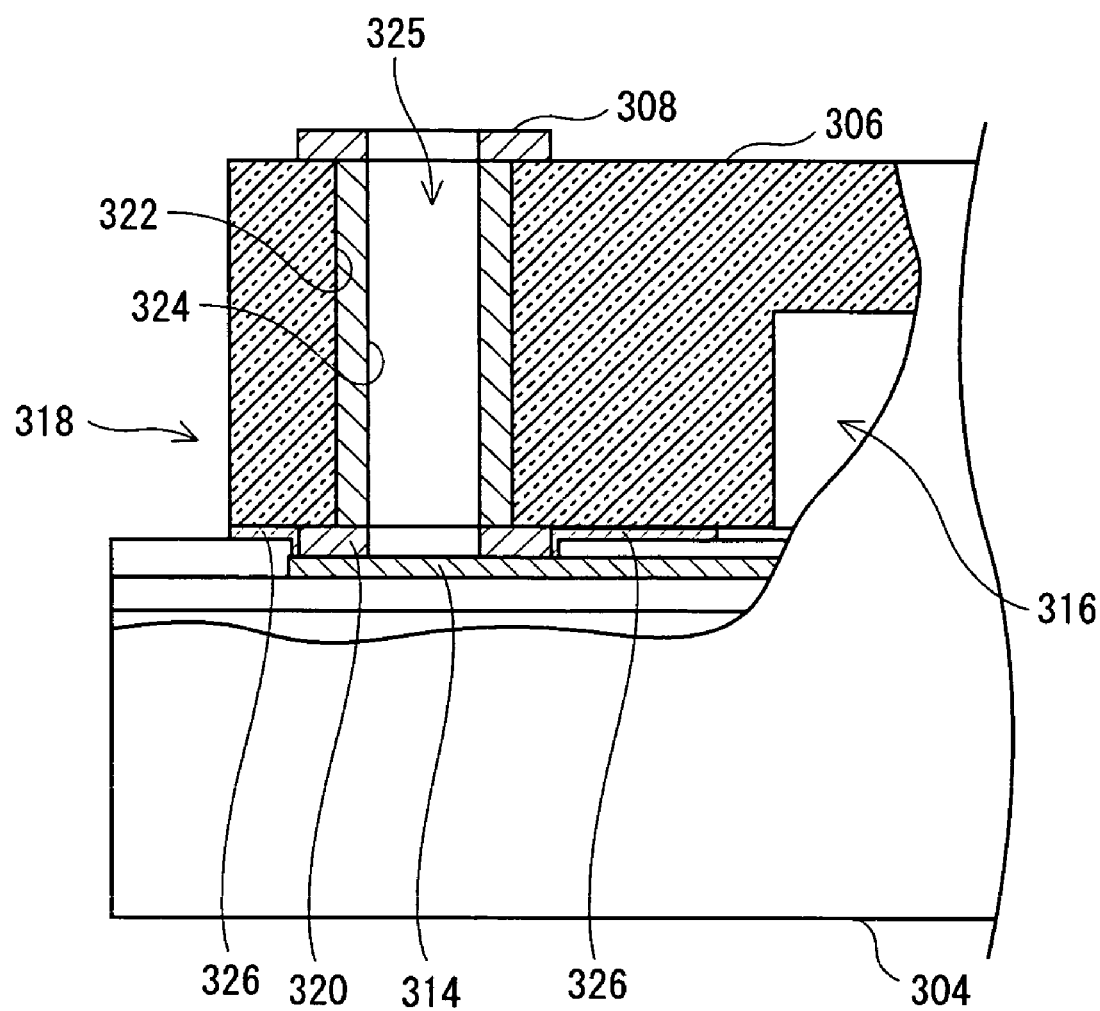
FIG. 24 shows an enlarged view of the portion B of FIG. 23, i.e. an enlarged view of the frame portion 318 and its periphery.

As a result of provision of the concave portion 316, a frame portion 318 in a square shape is formed on the transparent protection plate 306. FIG. 24 shows an enlarged view of the portion B of FIG. 23, i.e. an enlarged view of the frame portion 318 and its periphery.

As FIG. 24 shows, in the frame portion 318, the lower surface of the transparent protection plate 306 that opposes each terminal pad 308 is provided with conductive pads 320 that are in the same pattern formation as the terminal pads 308. Each conductive pad 320 is electrically connected to a corresponding one of the electrodes 314. In addition, holes 322 are provided with respect to the frame portion 318 so as to penetrate the transparent protection plate 306, for linking each terminal pad 308 with a corresponding conductive pad 320. A conductive foil 324 is attached to the side wall of each hole 322, to constitute a through hole 325 by means of a hole 322 and a conductive foil 324. An upper end of a conductive foil 324 is connected to a terminal pad 308, and a lower end thereof is connected to a conductive pad 320. Accordingly, an electrode 314 is to be electrically connected to a terminal pad 308 via a conductive member made of a conductive pad 320 and a conductive foil 324. By the stated arrangement, application of an input signal to the peripheral circuit portion 315 (FIG. 21) and extraction of an output signal therefrom are enabled via the terminal pads 308. It is optionally possible to fill the space of the through hole 325 with an insulation material.

An adhesive layer 326 attaches the lower surface of the frame portion 318 of the transparent protection plate 306 to the opposing surface (upper surface) of the solid-state imaging device 304, thereby sealing the light-receiving portion 310 airtight.

As explained above, in the solid-state imaging apparatus 302 according to the embodiment 3, the transparent protection plate 306 whose main surface has substantially the same area as that of the main surface of the solid-state imaging device 304 is used to seal the light-receiving portion 310 airtight. In addition, in the solid-state imaging apparatus 302, terminal pads 308 electrically connected to the electrodes of the solid-state imaging device 304 are formed on one main surface of the transparent protection plate 306 that is opposite to another main surface to which the solid-state imaging device 304 is attached. Accordingly, the lengthwise/widthwise size of the solid-state imaging apparatus 302 is reduced substantially to the size of the solid-state imaging device 304 (sensor chip). Moreover, the thickness of the solid-state imaging apparatus 302 is able to be restrained substantially to a summation of the thickness of the solid-state imaging device 304 and the thickness of a transparent protection plate 306. As a result, the solid-state imaging apparatus 302 has a considerably smaller size than the size of conventional solid-state imaging apparatuses.

Figure 25A:
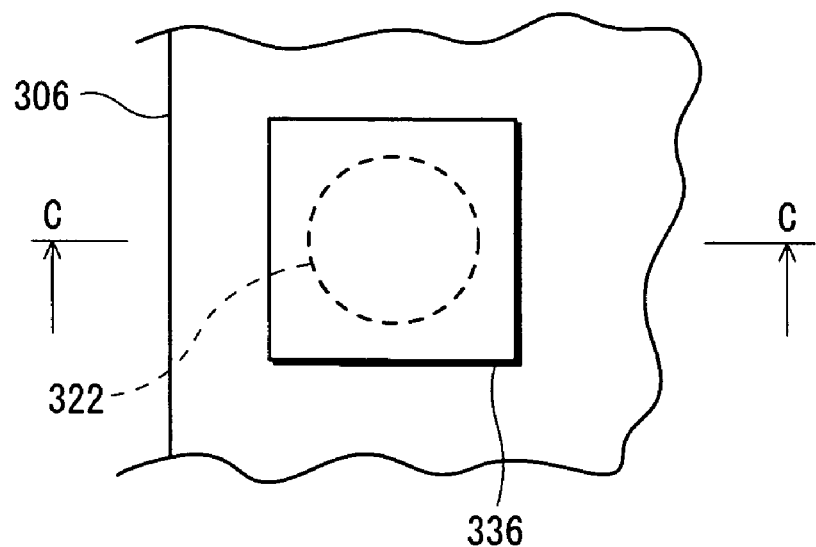
FIGS. 25A and 25B are respectively a diagram showing a modification example of the embodiment 3.
Figure 25B:
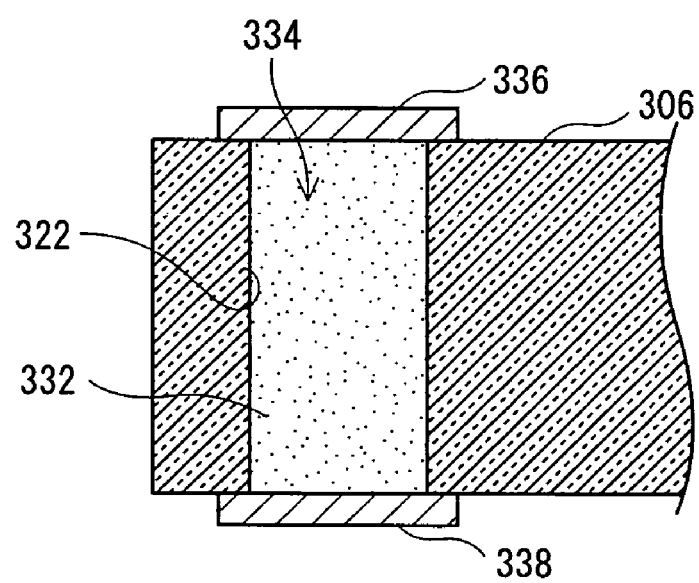

Note that in the above-described embodiment, the through hole 325 was explained to be constituted by attaching a conductive foil 324 to the side wall of a hole 322. However not limited to such a structure, an example of FIGS. 25A and 25B is also possible, for example. In FIGS. 25A and 25B, a hole 322 is filled with a conductive material 332 to structure a through hole 334. In this case, a terminal pad 336 and a conductive pad 338 can have a perfect square shape. An example of the conductive material 332 is silver paint.

Figure 26B:
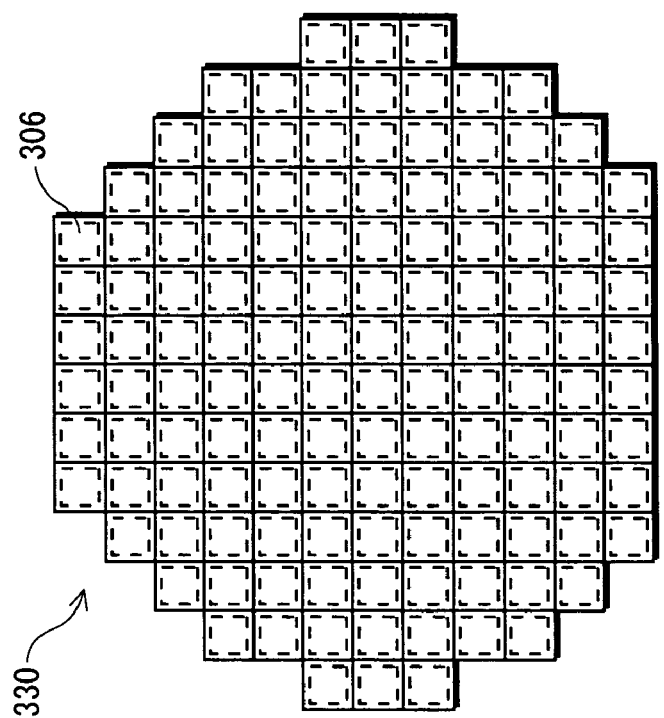
FIG. 26B is a plan view showing an overall structure of a transparent protection plate linkage member 330 in which a plurality of transparent protection plates 306 are linked to each other on one plane.
Figure 26A:
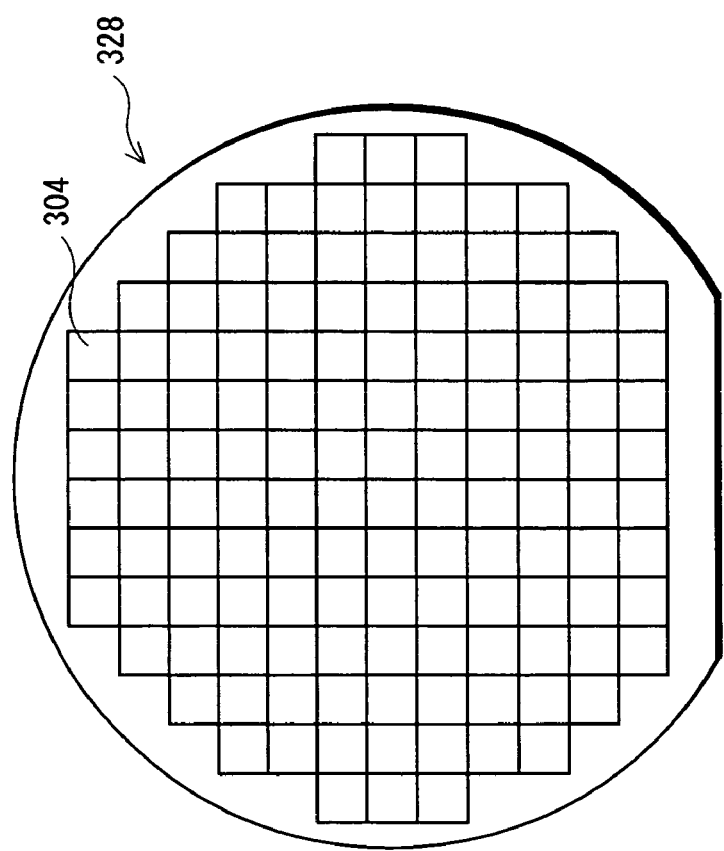
FIG. 26A is a plan view showing an overview of a wafer 328 formed by orderly arranging solid-state imaging devices 304 in both the lengthwise and widthwise directions.
Figure 27:
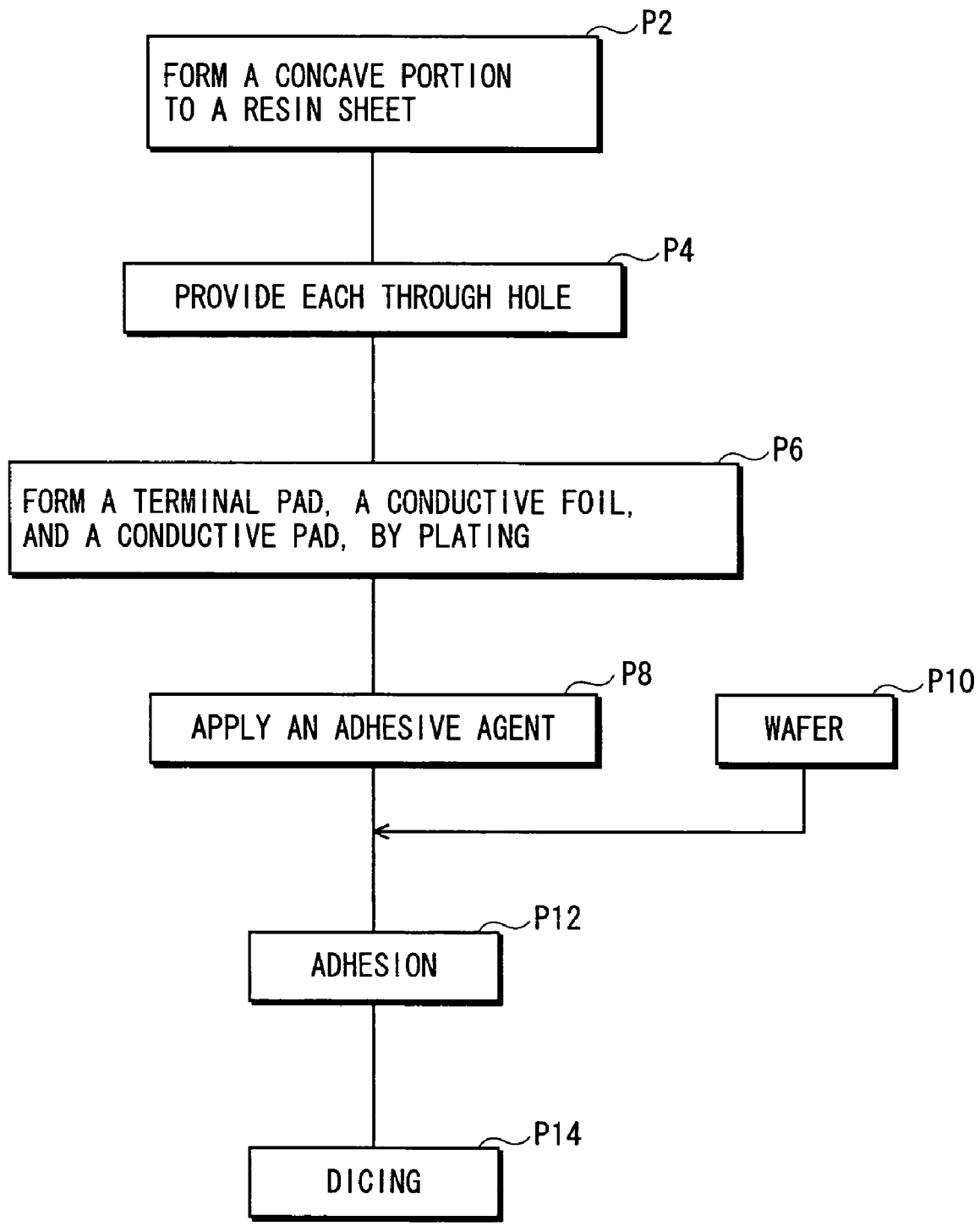
FIG. 27 is a diagram showing a manufacturing method of the solid-state imaging device 4.

The following describes a manufacturing method of a solid-state imaging apparatus 302 having the stated structure with reference to FIGS. 26A, 26B, and 27.

FIG. 26A is a plan view showing an overview of a wafer 328 formed by orderly arranging solid-state imaging devices 304 in both the lengthwise and widthwise directions. The wafer 328 is of a conventional type widely manufactured, in which light-receiving portions 310, peripheral circuit portions 315, electrodes 314, and the like, are created, by a semiconductor process, on one main surface of a base substrate made of silicon. The wafer 328 is in condition for immediate dicing, where individual solid-state imaging devices 304 are still linked to each other. FIG. 26B is a plan view showing an overall structure of a transparent protection plate linkage member 330 in which a plurality of transparent protection plates 306 are linked to each other on one plane. In the transparent protection plate linkage member 330, the arrangement of the transparent protection plates 306 corresponds to the arrangement of the solid-state imaging devices 304 on the wafer 328 explained above.

The following describes a manufacturing method of a solid-state imaging apparatus 302 that uses the wafer 328 and the transparent protection plate linkage member 330, with reference to the process diagram of FIG. 27.

First, a manufacturing method of the transparent protection plate linkage member 330 is explained.

A resin sheet (not illustrated) is prepared. After the resin sheet is heated to be softened, concave portions 316 (see FIG. 23) are formed by press forming (Step P2). In press forming, a pair of dies made up of a upper die and a lower die is used. With respect to the lower die, convex portions each corresponding to the concave portions 316 are arranged both in the lengthwise and widthwise directions. The upper die has a flat surface. In the press forming, the softened resin sheet is subjected to pressure by being sandwiched between the upper and lower dies.

Next, holes 322 (see FIG. 24) are opened (Step P4). For opening the holes 322, punching may be performed using a set of a punch and dies. Alternatively, a sandblasting method may be used to open the holes 322. In the sandblasting method, a protection plate is provided to be in contact with the upper surface of the resin sheet (the upper surface being a surface opposite to the surface provided with the concave portion), except for the positions at which the holes 322 are scheduled to be provided. Punching is specifically performed by blowing hard particles directed to the positions at which the holes 322 are scheduled to be provided.

Next, while masking the areas that exclude respective scheduled positions of the holes 322, the electrodes 314, and the conductive pads 320 (see FIG. 24), a plating method is used to attach a foil made of gold (Au) or aluminum (Al) to the resin sheet, thereby forming the conductive foils 324, the electrodes 314, and the conductive pads 320 (Step P6). The foil of gold (Au) or aluminum (Al) attached on the masks as well as the masks is removed prior to moving onto the next step. As a result of Step P6, the through holes 325 (see FIG. 24) complete. Note that prior to the step P6, if a step of filling each hole 322 with a conductive material in paste form and then hardening the conductive material to complete the conductive material 332 is performed, then the through holes 325 will be identical to the through holes 334.

As a result of Steps P2-P6, the transparent protection plate linkage member 330 (FIG. 26B) completes. Though not illustrated in FIG. 26B, around the transparent protection plate linkage member 330, a remainder of the resin sheet exists as a continuation of the linkage member.

An adhesive agent is applied to the lower surface (FIG. 24) of the frame portion 318 (FIG. 24) of the transparent protection plate linkage member 330, where the lower surface is at the side where the concave portion 316 is formed (Step P8). After this, the transparent protection plate linkage member 330 is superposed and pressed onto the wafer 328, so that the lower surface of the frame portion 318 be in contact with the wafer 328 (Step P12). As a result, the conductive pads 320 (FIG. 24) push away the adhesive agents to their vicinities, thereby contacting the conductive pads 320 and the electrodes 314. It should be noted here that the adhesive agent may alternatively be applied onto the wafer 328 instead of onto the transparent protection plate linkage member 330. This is realized for example by the following concrete method. The transparent protection plate linkage member 330 is first superposed onto the wafer 328 so that each transparent protection plate 306 is superposed on a corresponding solid-state imaging device 304. Then in the area that faces the frame portion 318, an adhesive agent is applied by a screen printing method. For attaching the transparent protection plate linkage member 330 to the wafer 328, it is possible to provide bumps between the conductive pads and corresponding electrodes 314. Furthermore, it is also possible to apply an adhesive agent to both of the transparent protection plate linkage member 330 and the wafer 328.

Then, after the adhesive agent is hardened, the wafer to which the transparent protection plate linkage member 330 has been attached is diced to respective pieces (Step P14), thereby completing each solid-state imaging apparatus 302 (as shown in FIG. 20).

Embodiment 4

A solid-state imaging apparatus according to the embodiment 4 has principally the same structure as the solid-state imaging apparatus 302 according to the embodiment 3, except for the manner of connection between the terminal pads and the conductive pads on a transparent protection plate. Accordingly, the structural elements that are the same as the structural elements of the embodiment 3 are assigned the same reference numbers, and explanation thereof is either omitted or restrained to minimum in the following description, so that the explanation of the connection manner is mainly focused.

Figure 28:
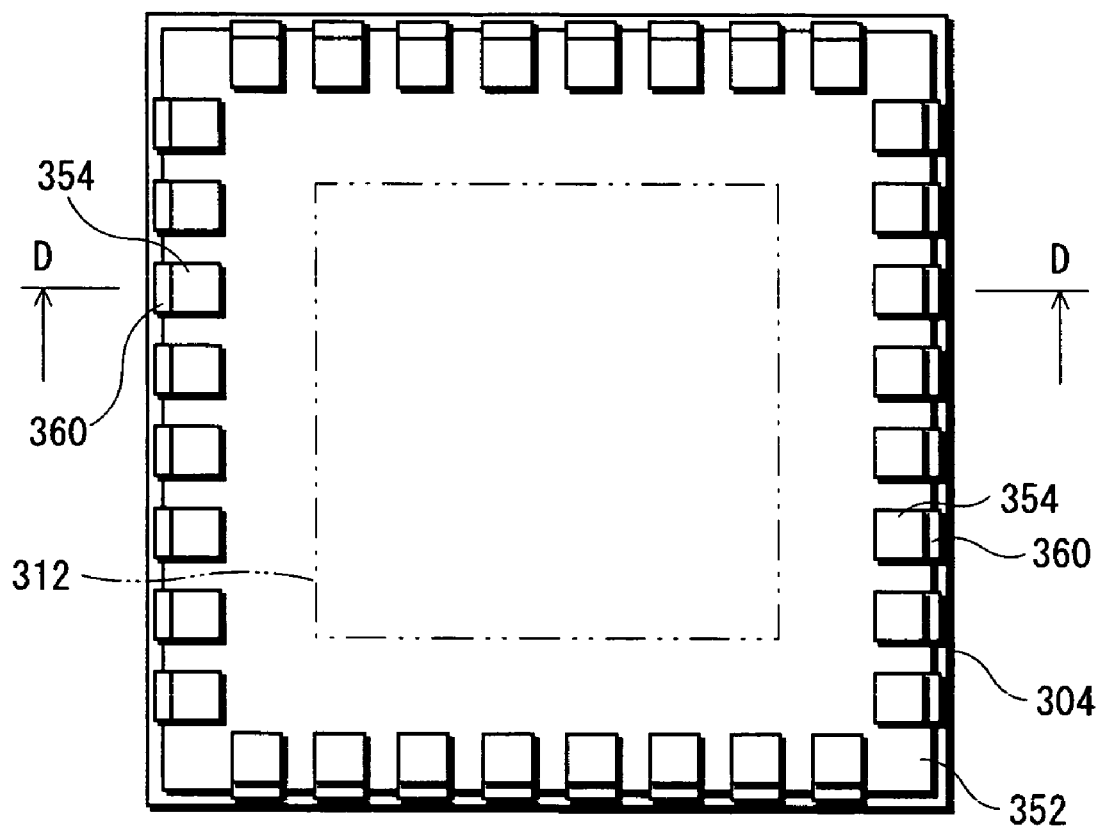
FIG. 28 is a plan view of a solid-state imaging apparatus 350 according to the embodiment 4.
Figure 29:
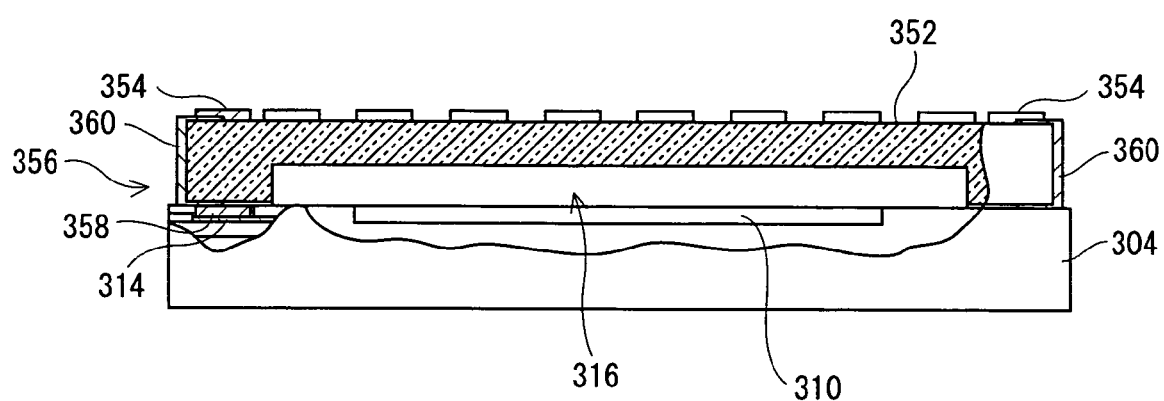
FIG. 29 is a cross sectional diagram of the solid-state imaging apparatus 350 of FIG. 28, which is cut at the line D-D.

FIG. 28 is a plan view of a solid-state imaging apparatus 350 according to the embodiment 4, and FIG. 29 is a cross sectional diagram of the solid-state imaging apparatus 350 of FIG. 28, which is cut at the line D-D.

As FIG. 28 shows, in the solid-state imaging apparatus 350 too, a plurality of terminal pads 354 are provided in areas of the upper surface of the transparent protection plate 352 that do not prevent light from traveling onto the light-receiving area 312 of the solid-state imaging device 304. Note that the positions of the terminal pads 354 are the same as the positions of the terminal pads 308 (FIG. 22) of the embodiment 3.

In addition, as FIG. 29 shows, in the lower surface of the frame portion 356 of the transparent protection plate 352, and at a position facing each terminal pad 354, a corresponding conductive pad 358 connected to an electrode 314 is formed. Note that the conductive pads 358 have the same shape as the shape of the terminal pads 354.

Figure 30:
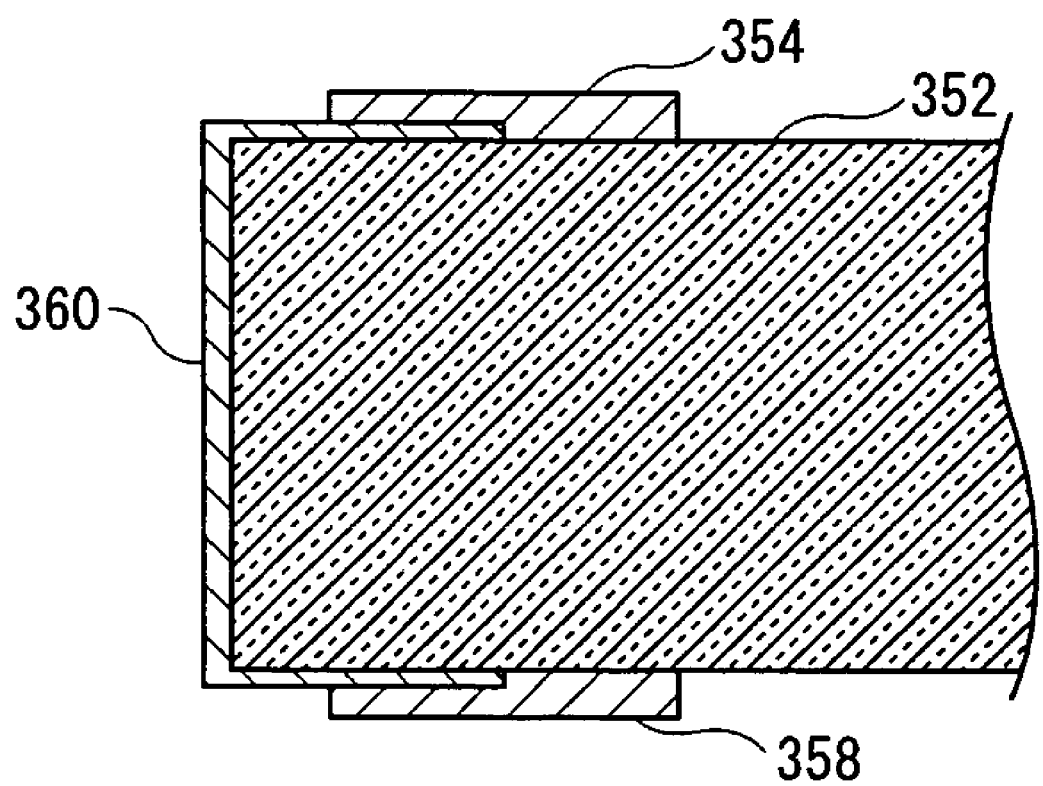
FIG. 30 is a diagram showing a sectional view of the transparent protection plate 352 at a position where a terminal pad 354 and a conductive pad 358 are formed.

FIG. 30 is a diagram showing a sectional view of the transparent protection plate 352 at a position where a terminal pad 354 and a conductive pad 358 are formed. As FIG. 30 shows, a conductive foil 360, being a conductive member, is formed from one main surface to the other main surface via a side surface of the transparent protection plate 352. One end of the conductive foil 360 is connected to the terminal pad 354, and the other end of the conductive foil 360 is connected to the conductive pad 358. As a result, the terminal pad 354 and the conductive pad 358 are electrically connected to each other. The conductive foil 360 is made of gold (Au) or aluminum (Al), for example, and may be formed in a plating method.

Each of the solid-state imaging apparatus 302 according to the embodiment 3 and the solid-state imaging apparatus 350 according to the embodiment 4 is for use as a component of an imaging apparatus such as a digital camera, and is specifically mounted to a print wiring board provided within the apparatus itself.

Figure 31:
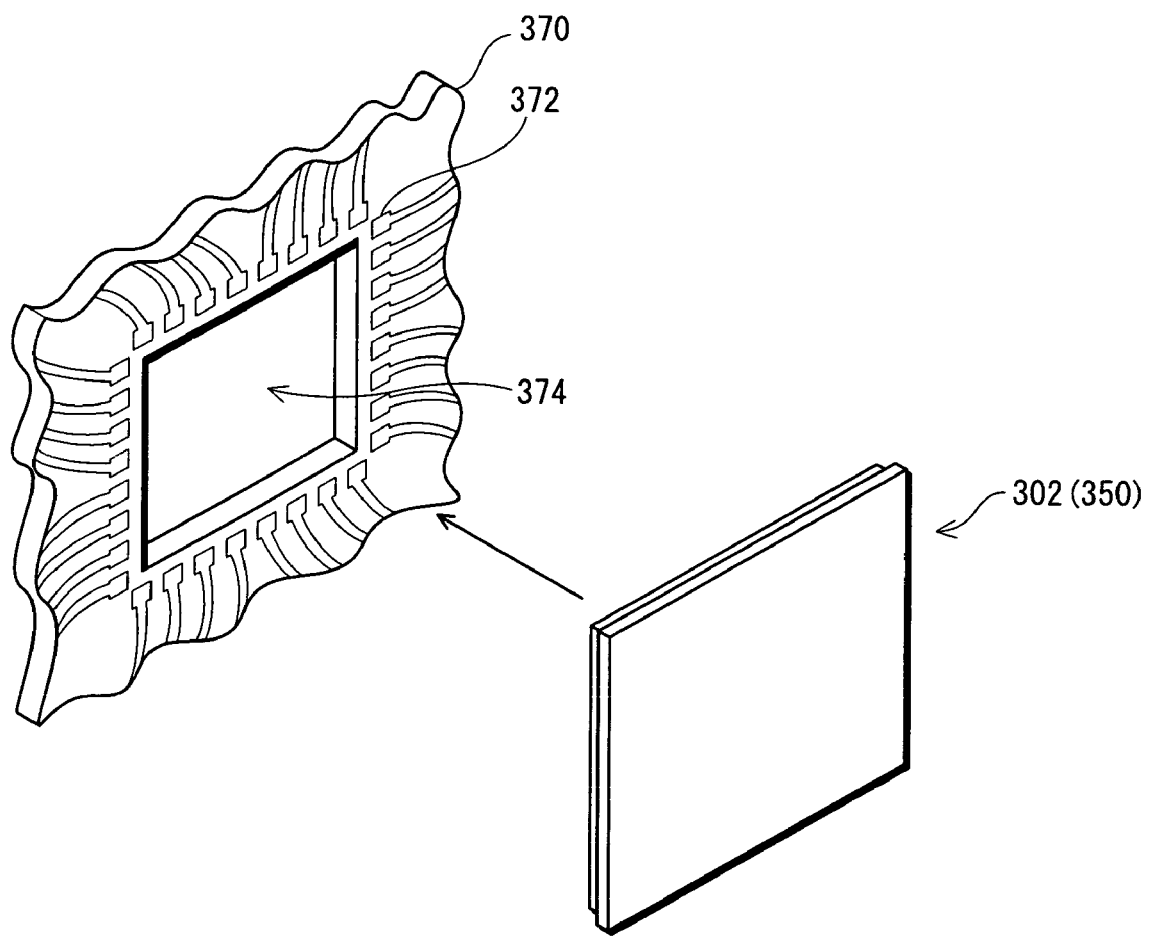
FIG. 31 is a perspective diagram of the part of the print wiring board 370 that is to be mounted in the solid-state imaging apparatus 302 (350).

FIG. 31 is a perspective diagram of the part of the print wiring board 370 to which the solid-state imaging apparatus 302 (350) is to be mounted. The print wiring board 370 has lands 372 whose arrangement is the same as the arrangement of the terminal pads 308 (354) of the solid-state imaging apparatus 302 (350). The print wiring board 370 is provided with a rectangular window 374 inside of the lands 372. The solid-state imaging apparatus 302 (350) is mounted to the print wiring board 370, by means of a flip chip mounting by which the lands 372 are directly connected to the terminal pads 308 (354) via the bumps (not illustrated). Relating to the above, the ACF (an isotropic conductive foil) mounting method may also be adopted, where the ACF mounting method uses ACF and is one kind of the flip chip mounting.

A camera lens (not illustrated) is provided at the front (left side in the paper in which the drawing is drawn) of the solid-state imaging apparatus 302 (350) to which the print wiring board 370 has been attached. The light from the camera lens passes through the window 374 to be incident onto the solid-state imaging apparatus 302 (350), so that photographing be performed.

In this way, according to the solid-state imaging apparatus 302 (350) of the present embodiment, the required mounting space (lengthwise/widthwise size) of the solid-state imaging apparatus 302 (350) to the print wiring board 370 is restrained substantially down to the size of the solid-state imaging device 304 (sensor chip). Moreover the solid-state imaging apparatus 302 (350) will have a height that is restrained substantially down to the summation of the thickness of the solid-state imaging device 304 and the thickness of the transparent protection plate 306 (352). As a result, the solid-state imaging apparatus 302 (350) is able to contribute to further size reduction of imaging apparatuses, compared to cases where conventional solid-state imaging apparatuses are used.

In addition, according to the solid-state imaging apparatus 302 (350) of the present embodiment, a corresponding imaging apparatus is able to have a size smaller in the optical-axis direction of the camera lens, meaning that the imaging apparatus is more slim than conventional imaging apparatuses. The reason is as follows. When a conventional solid-state imaging apparatus 200 (FIG. 2) is adopted, a print wiring board should be positioned outside the focus distance of the camera lens (i.e. the focus distance is between the camera lens and the light-receiving surface of the solid-state imaging device). In contrast, when the solid-state imaging apparatus 302 (350) according to the present embodiment is adopted, the print wiring board is able to be positioned within the focus distance of the camera lens. In particular, the effect of making more slim imaging apparatuses would be more distinguished when the solid-state imaging apparatus 302 (350) is adopted for a camera-included mobile telephone that inherently has a substantial thickness in the optical-axis direction of the camera lens.

Figure 2:
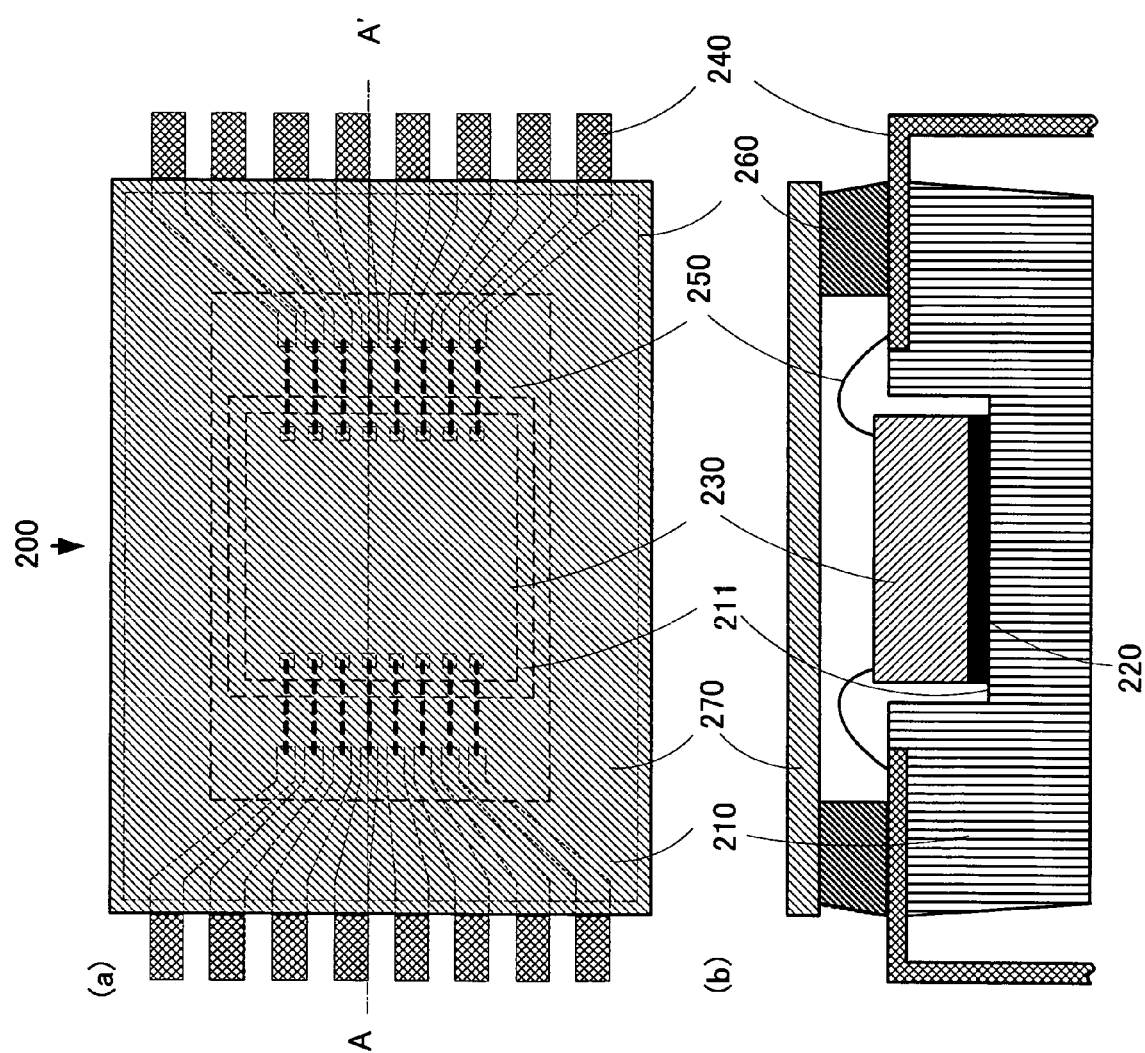
FIG. 2A is a plan view showing an overview of a conventional solid-state imaging apparatus 200 disclosed in the Patent Reference 2.
FIG. 2B is a diagram showing a cross sectional view of the solid-state imaging apparatus 200 of FIG. 2A, which is cut at the line of A-A'.

Furthermore, the solid-state imaging apparatus 302 (350) according to the present embodiment has an improved positional accuracy between the light-receiving surface of the solid-state imaging device and the camera lens, compared to the conventional solid-state imaging apparatus 200 of FIG. 2. The reason is as follows. In both of the solid-state imaging apparatuses, positional alignment between the camera lens and the solid-state imaging apparatus is performed using the print wiring board as a reference. According to the conventional solid-state imaging apparatus 200, two components (i.e. a base portion 210 and a lead frame 240) are interposed between the CCD chip (solid-state imaging device) 230 and the print wiring board. According to the stated structure, the positional accuracy is affected by accumulation of variations caused in manufacturing the two components and variations caused in mounting the components. As opposed to this, according to the solid-state imaging apparatus 302 (350) of the present embodiment, only one component, namely a transparent protection plate 306 (352) will be interposed between the solid-state imaging device 304 and the print wiring board. Accordingly, in the solid-state imaging apparatus 302 (350), there will be smaller accumulation of such variations compared to the case of the conventional solid-state imaging apparatus 200.

Figure 32:
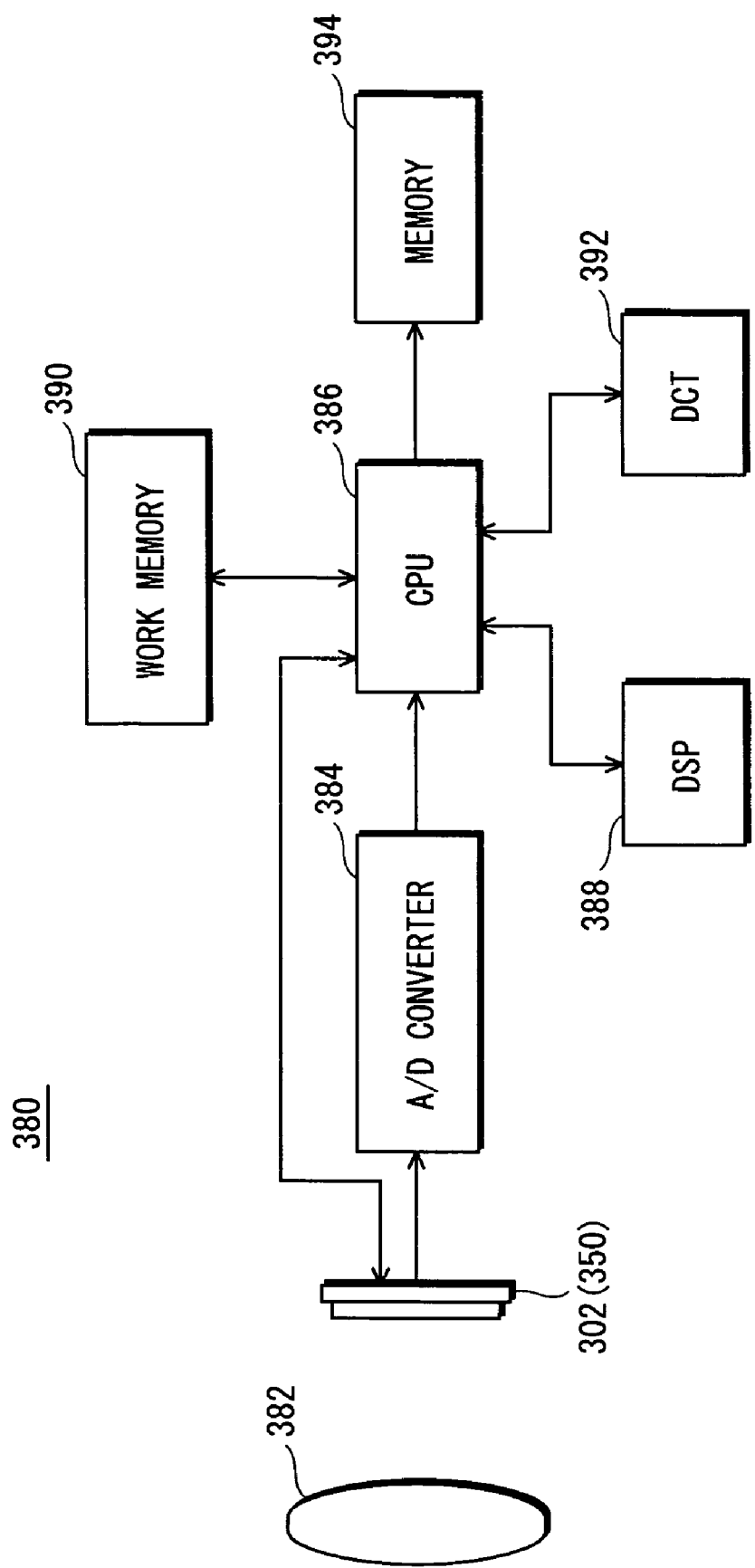
FIG. 32 is a block diagram showing an overall structure of a digital camera 380 that adopts the solid-state imaging apparatus 302 (350).

FIG. 32 is a block diagram showing an overall structure of a digital camera 380 that adopts the solid-state imaging apparatus 302 (350). The camera lens 382 forms an image of an object on the light-receiving surface of the light-receiving portion 310 of the solid-state imaging apparatus 302 (350). The solid-state imaging apparatus 302 (350) performs photoelectric conversion on the formed image pixel by pixel, and outputs charges to an A/D converter 384, pixel by pixel. The A/D converter 384 converts charges inputted from the solid-state imaging apparatus 302 (350) pixel by pixel, and outputs converted charges to the DSP (digital signal processor) 388 via a CPU 386. The DSP 388 performs image processing (e.g. color correction and resolution conversion) on inputted image data, and outputs the image obtained after the image processing to the CPU 386 as digital images. In response, the CPU 386 temporarily stores received digital images in a work memory 390. The digital images stored in the work memory 390 undergoes compression by means of a DCT (Discrete Cosine Transform) chip 392, and is stored thereafter in a recording memory 394. Note that the CPU 386 exercises comprehensive control over the entire system (see FIG. 32).

So far, the present invention has been described by way of embodiments. However needless to say, the present invention should not be limited to the described embodiments. For example, the following modifications are possible:

(1) In the above-described embodiments, a MOS-type image sensor chip is adopted for the solid-state image device. However, the present invention is not limited to such a structure, and a CCD image sensor chip may alternatively be adopted as the solid-state imaging device, for example. Furthermore, the present invention may be applied to a liner image sensor or to an area image sensor.

(2) Moreover, an image apparatus to which the present invention is applied is not limited to a digital camera, and may be any type of imaging apparatus, such as a camera-included mobile telephone. In other words, the present invention can be applied to any apparatus that realizes a photographing function by means of a solid-state imaging apparatus.

INDUSTRIAL APPLICABILITY

The present invention is applicable to imaging apparatuses such as a home video camera, a digital still camera, and a camera-included mobile telephone. The present invention offers a solid-state imaging apparatus having reduced area, volume, and weight, which contributes to reduction of size and weight of cameras.

In addition, the present invention offers a solid-state imaging apparatus having much more excellent productivity compared to the conventional cases, which contributes to price reduction of cameras.

Accordingly, the present invention is of extremely high value in terms of industrial applicability.

Not only limited to home use cameras, the present invention is also applicable to any type of cameras.

In addition, in the above-stated examples, the light-receiving area is explained to be provided with light-receiving cells arranged two-dimensionally. However, the present invention is also applicable to a line sensor and the like, in which light-receiving cells are arranged one dimensionally.

The invention claimed is:

1. A solid-state imaging apparatus being one of pieces diced from an assembly, the solid-state imaging apparatus comprising:

a light-receiving chip having a plurality of light-receiving cells arranged either one dimensionally or two dimensionally on a main surface of a base substrate, the main surface being made up of a light-receiving area on which the light-receiving cells are arranged and a periphery area surrounding the light-receiving area;

a transparent protection plate, at least a part thereof that corresponds to the light-receiving area being transparent; and a collective lens of the light-receiving cells, wherein the transparent protection plate has a skirt portion at a periphery thereof, the skirt portion is positioned on the periphery area of the main surface thereby forming a space between the light-receiving cells and the transparent protection plate, the assembly is comprised of two layers, the two layers being a sheet of transparent protection plates and a semiconductor wafer of light-receiving chips that are attached to each other such that each transparent protection plate is combined with a corresponding light-receiving chip, and the diced pieces have such diced edges that result by cutting the two layers simultaneously, the skirt portion is formed of a sealing material, and the thickness of a space between the transparent protection plate and the light-receiving cells is greater than a height of the collective lens by 10μm-100μm.

2. The solid-state imaging apparatus of claim 1, further comprising a through hole passing through the base substrate.

3. The solid-state imaging apparatus of claim 1, further comprising a plurality of through holes passing through the base substrate.

4. The solid-state imaging apparatus of claim 2, further comprising an electrode disposed on a back surface opposite to the main surface and connected to the through hole.

5. The solid-state imaging apparatus of claim 2, wherein the through hole electrically connects an electrode disposed on the main surface and an electrode disposed on a back surface opposite to the main surface.

6. The solid-state imaging apparatus of claim 3, wherein the plurality of through holes electrically connect electrode disposed on the main surface and electrodes disposed on a back surface opposite to the main surface, respectively.

7. The solid-state imaging apparatus of claim 6, wherein the plurality of through holes are insulated from each other.

8. A solid-state imaging apparatus being one of pieces diced from an assembly, the solid-state imaging apparatus comprising:

a light-receiving chip having a plurality of light-receiving cells arranged either one dimensionally or two dimensionally on a main surface of a base substrate, the main surface being made up of a light-receiving area on which the light-receiving cells are arranged and a periphery area surrounding the light-receiving area;

a transparent protection plate, at least a part thereof that corresponds to the light-receiving area being transparent; and a collective lens of the light-receiving cells, wherein the transparent protection plate has a skirt portion at a periphery thereof, the skirt portion is positioned on the periphery area of the main surface thereby forming a space between the light-receiving cells and the transparent protection plate, the assembly is comprised of two layers, the two layers being a sheet of transparent protection plates and a semiconductor wafer of light-receiving chips that are attached to each other such that each transparent protection plate is combined with a corresponding light-receiving chip, and the diced pieces have such diced edges that result by cutting the two layers simultaneously, the skirt portion is formed of a sealing material, and a space between the transparent protection plate and the light-receiving cells is filled with a resin whose refractive index is smaller than that of the collective lens.

9. The solid-state imaging apparatus of claim 8, further comprising a through hole passing through the base substrate.

10. The solid-state imaging apparatus of claim 8, further comprising a plurality of through holes passing through the base substrate.

11. The solid-state imaging apparatus of claim 9, further comprising an electrode disposed on a back surface opposite to the main surface and connected to the through hole.

12. The solid-state imaging apparatus of claim 9, wherein the through hole electrically connects an electrode disposed on the main surface and an electrode disposed on a back surface opposite to the main surface.

13. The solid-state imaging apparatus of claim 10, wherein the plurality of through holes electrically connect electrodes disposed on the main surface and electrodes disposed on a back surface opposite to the main surface, respectively.

14. The solid state imaging apparatus of claim 13, wherein the plurality of through holes are insulated from each other.

\* \* \* \* \*

UNITED STATES PATENT AND TRADEMARK OFFICE
CERTIFICATE OF CORRECTION

PATENT NO. : 7,859,586 B2
APPLICATION NO. : 10/583095
DATED : December 28, 2010
INVENTOR(S) : Takahiko Murata et al.

It is certified that error appears in the above-identified patent and that said Letters Patent is hereby corrected as shown below:

Specifically, on the Title Page, Section (22) is incorrect and Sections (86) and (87) are missing.

In Section (22), it currently lists the date filed as June 16, 2007 however it should read:

(22) PCT Filed: December 17, 2004

Section (86) should be added and read:

(86) PCT No.: PCT/JP2004/018927

§371 (c)(1), (2) (4) Date: April 20, 2007

Section (87) should be added and read:

PCT Pub. No.: WO 2005/060004

PCT Pub Date: June 30, 2005

Signed and Sealed this
Third Day of April, 2012

David J. Kappos
*Director of the United States Patent and Trademark Office*